United States Patent
Hosotani et al.

(10) Patent No.: US 11,227,832 B2
(45) Date of Patent: *Jan. 18, 2022

(54) SEMICONDUCTOR MEMORY DEVICE HAVING A MEMORY CELL AND SEMICONDUCTOR LAYER

(71) Applicant: TOSHIBA MEMORY CORPORATION, Tokyo (JP)

(72) Inventors: Keiji Hosotani, Mie (JP); Fumitaka Arai, Mie (JP); Keisuke Nakatsuka, Hyogo (JP); Nobuyuki Momo, Mie (JP); Motohiko Fujimatsu, Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/564,584

(22) Filed: Sep. 9, 2019

(65) Prior Publication Data

US 2020/0286828 A1  Sep. 10, 2020

(30) Foreign Application Priority Data

Mar. 6, 2019  (JP) .............................. JP2019-040267

(51) Int. Cl.
*H01L 23/528* (2006.01)
*H01L 27/1157* (2017.01)
(Continued)

(52) U.S. Cl.
CPC ...... *H01L 23/5283* (2013.01); *G11C 16/0483* (2013.01); *H01L 23/5226* (2013.01);
(Continued)

(58) Field of Classification Search
CPC ............ G11C 16/0483; H01L 23/5283; H01L 23/5226; H01L 27/11519; H01L 27/11524;
(Continued)

(56) References Cited

U.S. PATENT DOCUMENTS 7,382,018 B2   6/2008  Kim et al.
9,224,429 B2  12/2015  Park et al.
(Continued)

FOREIGN PATENT DOCUMENTS

JP    2008-078404 A    4/2008

OTHER PUBLICATIONS

U.S. Appl. No. 16/562,372, filed Sep. 5, 2019, Toshiba Memory Corp.
(Continued)

*Primary Examiner* — Sung Il Cho
(74) *Attorney, Agent, or Firm* — Foley & Lardner LLP

(57) ABSTRACT

According to one embodiment, a semiconductor memory device includes: a first semiconductor layer including first to third portions which are arranged along a first direction and differ in position from one another in a second direction; a conductive layer including a fourth portion extending in the second direction and a fifth portion extending in the first direction; a first insulating layer between the fourth portion and the first semiconductor layer and between the fifth portion and the first semiconductor layer; a first contact plug coupled to the fourth portion; a second contact plug coupled to the first semiconductor layer in a region where the first insulating layer is formed; a first interconnect; and a first memory cell apart from the fifth portion in the first direction and storing information between the semiconductor layer and the first interconnect.

17 Claims, 23 Drawing Sheets

FIG. 10

(51) Int. Cl.
  *H01L 27/11582* (2017.01)
  *H01L 23/522* (2006.01)
  *H01L 27/11519* (2017.01)
  *H01L 27/11524* (2017.01)
  *H01L 27/11556* (2017.01)
  *H01L 27/11565* (2017.01)
  *G11C 16/04* (2006.01)

(52) U.S. Cl.
  CPC .... *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
  CPC ......... H01L 27/11556; H01L 27/11565; H01L 27/1157; H01L 27/11582
  USPC .................................................... 365/185.17
  See application file for complete search history.

(56) References Cited

U.S. PATENT DOCUMENTS

| | | | |
|---|---|---|---|
| 9,224,474 | B2 | 12/2015 | Lue |
| 9,236,127 | B2 | 1/2016 | Rhie |
| 9,343,152 | B2 | 5/2016 | Rhie |
| 9,805,927 | B2 | 10/2017 | Fujii et al. |
| 10,056,433 | B2 | 8/2018 | Kiyotoshi et al. |
| 2015/0098274 | A1* | 4/2015 | Rhie ................. G11C 16/0416 365/185.17 |
| 2019/0157282 | A1* | 5/2019 | Jung ................. H01L 27/11556 |
| 2019/0172906 | A1* | 6/2019 | Kim ..................... H01L 27/1157 |
| 2019/0304985 | A1* | 10/2019 | Lai ....................... H01L 29/7926 |
| 2019/0326315 | A1* | 10/2019 | Lee ..................... H01L 27/11582 |
| 2019/0393238 | A1* | 12/2019 | Lim ..................... H01L 27/1157 |
| 2020/0194458 | A1* | 6/2020 | Kim ................... H01L 27/11565 |
| 2020/0235114 | A1* | 7/2020 | Oh ..................... H01L 27/11556 |

OTHER PUBLICATIONS

Office Action, U.S. Appl. No. 16/562,372, dated Jan. 1, 2021.
Notice of Allowance on U.S. Appl. No. 16/562,372 dated Apr. 16, 2021.

* cited by examiner

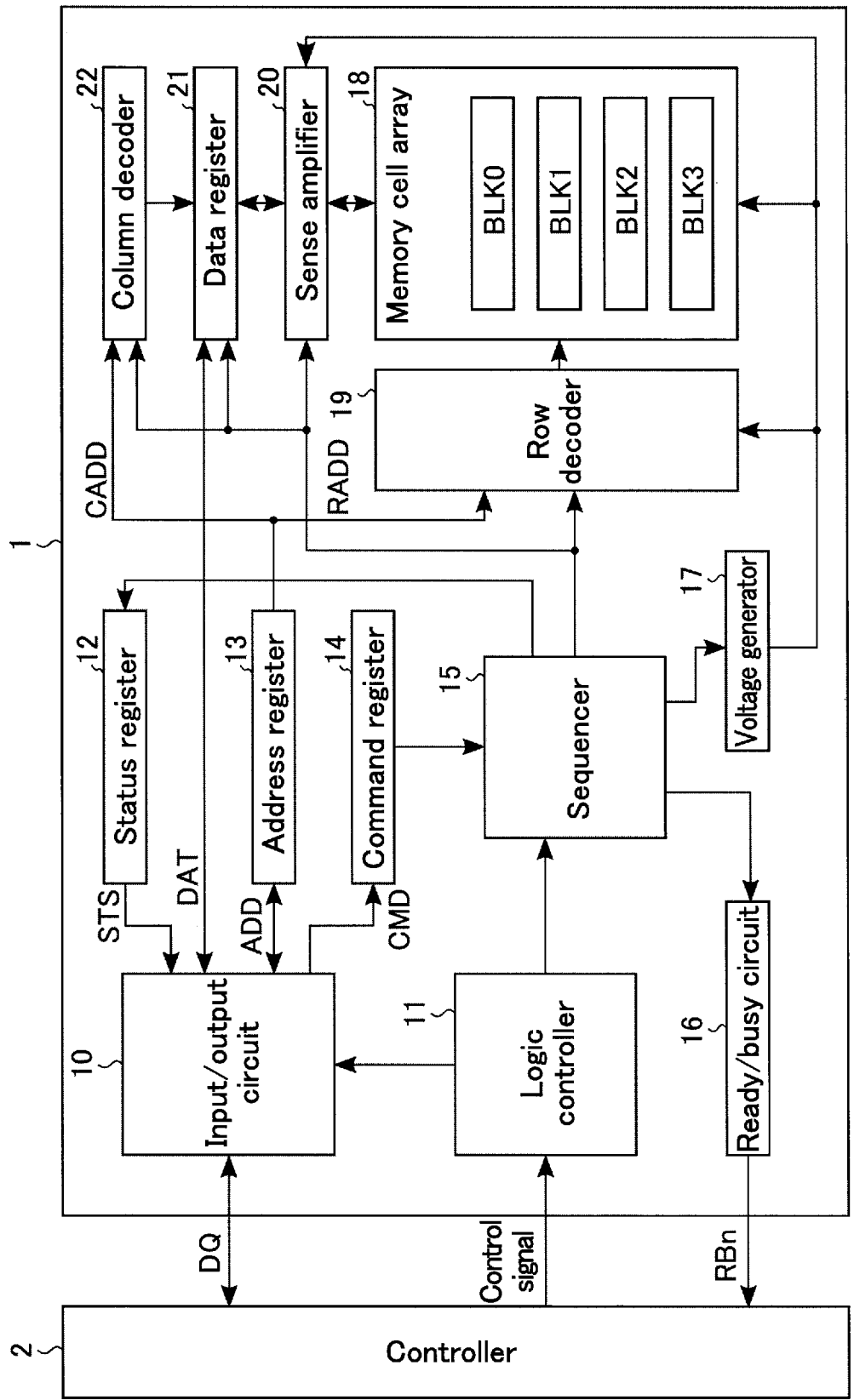
F I G. 1

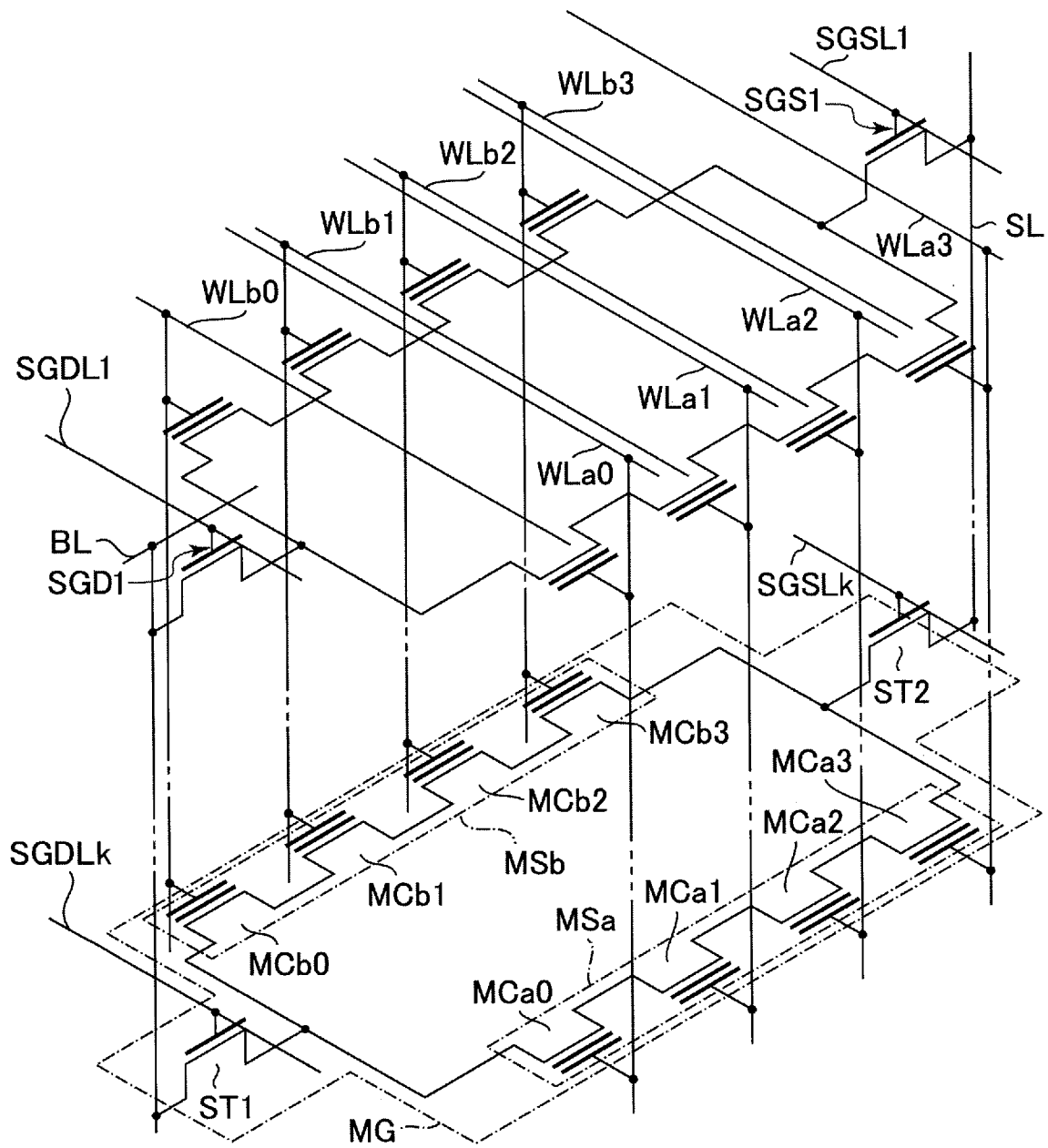
F I G. 3

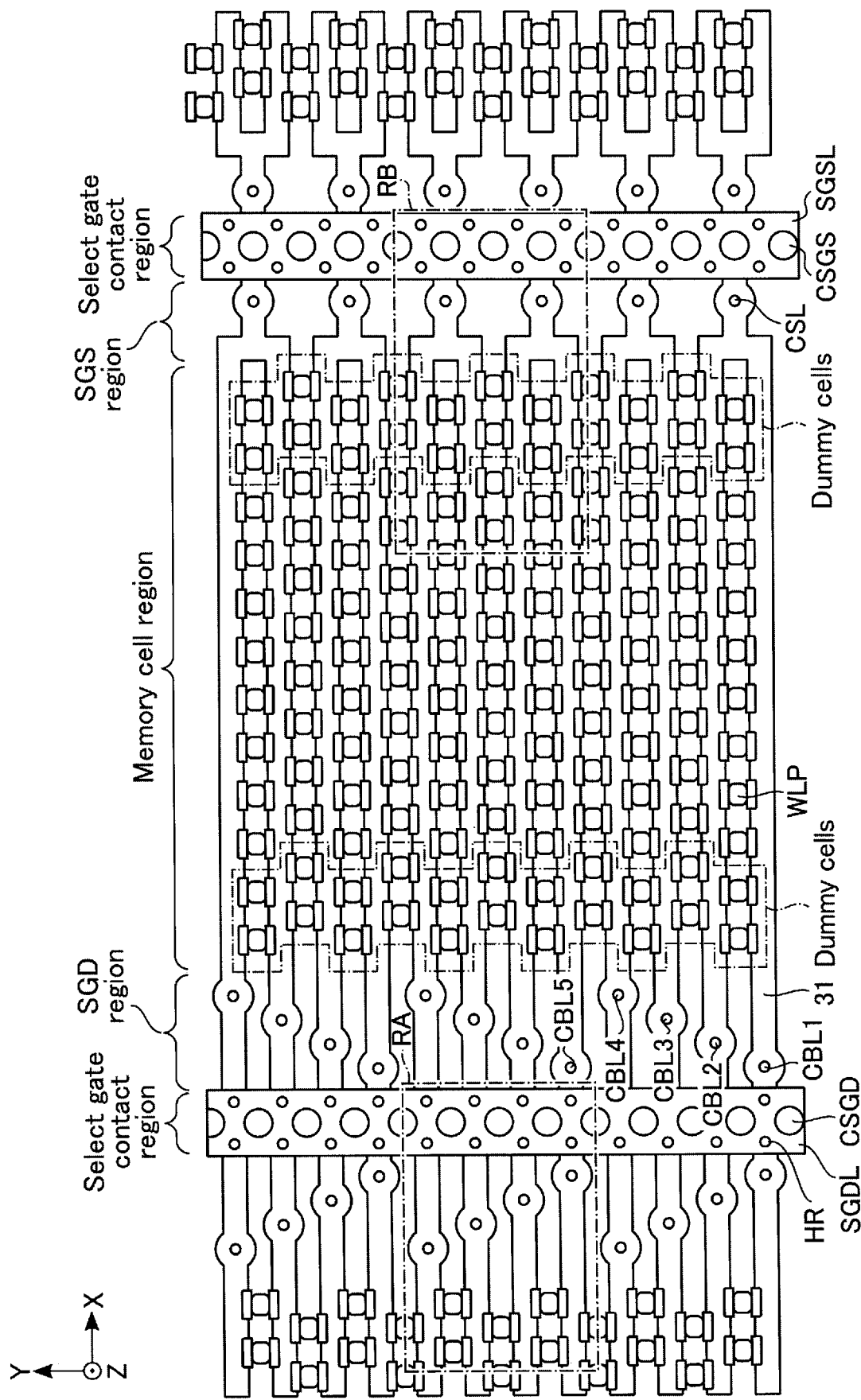
F I G. 6

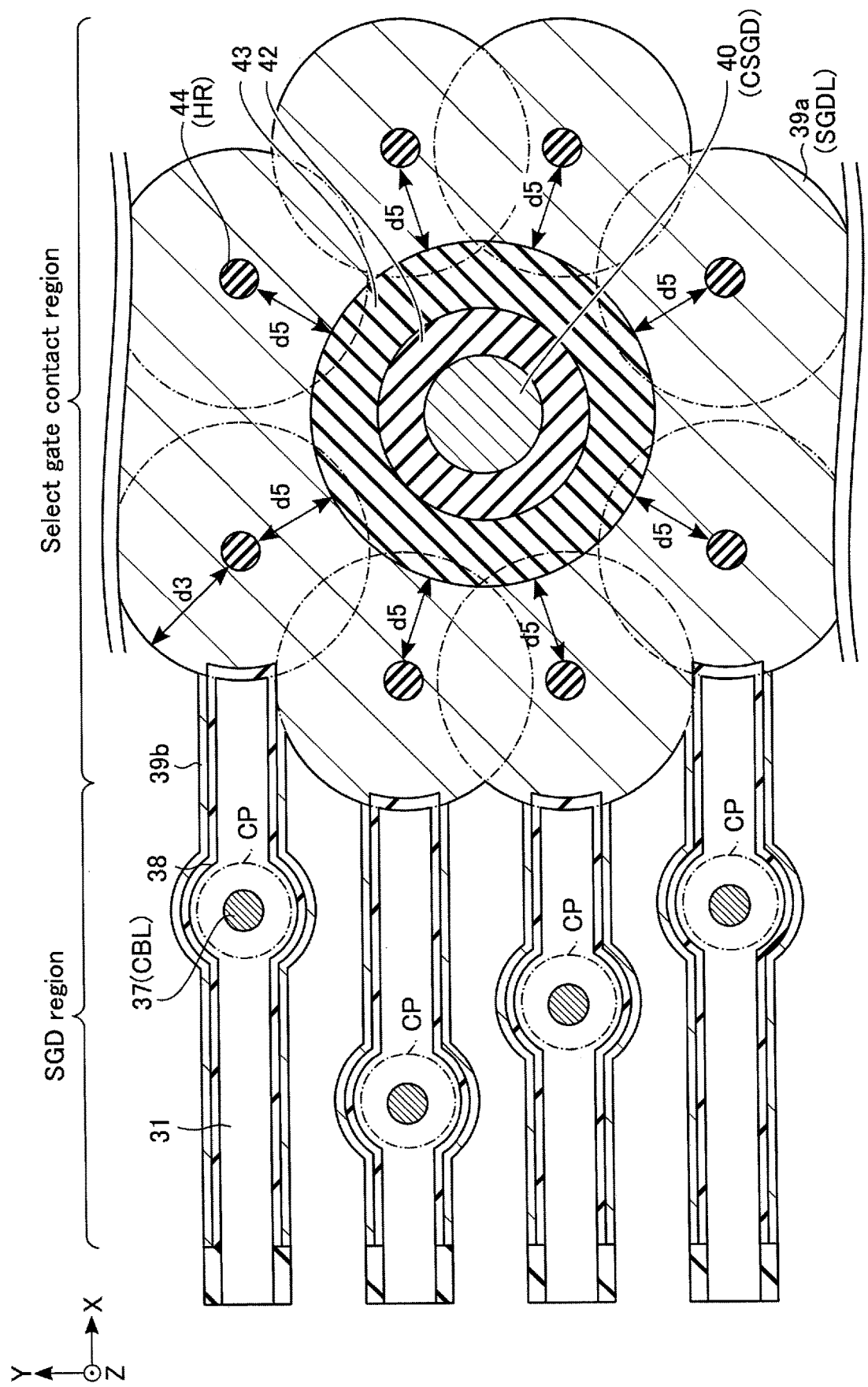
F I G. 18

SEMICONDUCTOR MEMORY DEVICE HAVING A MEMORY CELL AND SEMICONDUCTOR LAYER

CROSS-REFERENCE TO RELATED APPLICATION

This application is based upon and claims the benefit of priority from prior Japanese Patent Application No. 2019-040267, filed Mar. 6, 2019, the entire contents of which are incorporated herein by reference.

FIELD

Embodiments described herein relate generally to a semiconductor memory device.

BACKGROUND

NAND flash memories are known as semiconductor memory devices.

BRIEF DESCRIPTION OF THE DRAWINGS

FIG. 1 is a block diagram of a semiconductor memory device according to a first embodiment;

FIG. 3 is a circuit diagram of the memory cell array included in the semiconductor memory device according to the first embodiment;

FIG. 6 is a top view of a semiconductor layer in the memory cell array included in the semiconductor memory device according to the first embodiment;

FIG. 18 is a top view of a select gate contact region in a memory cell array included in a semiconductor memory device according to a second example of the second embodiment;

DETAILED DESCRIPTION

Figure 2:
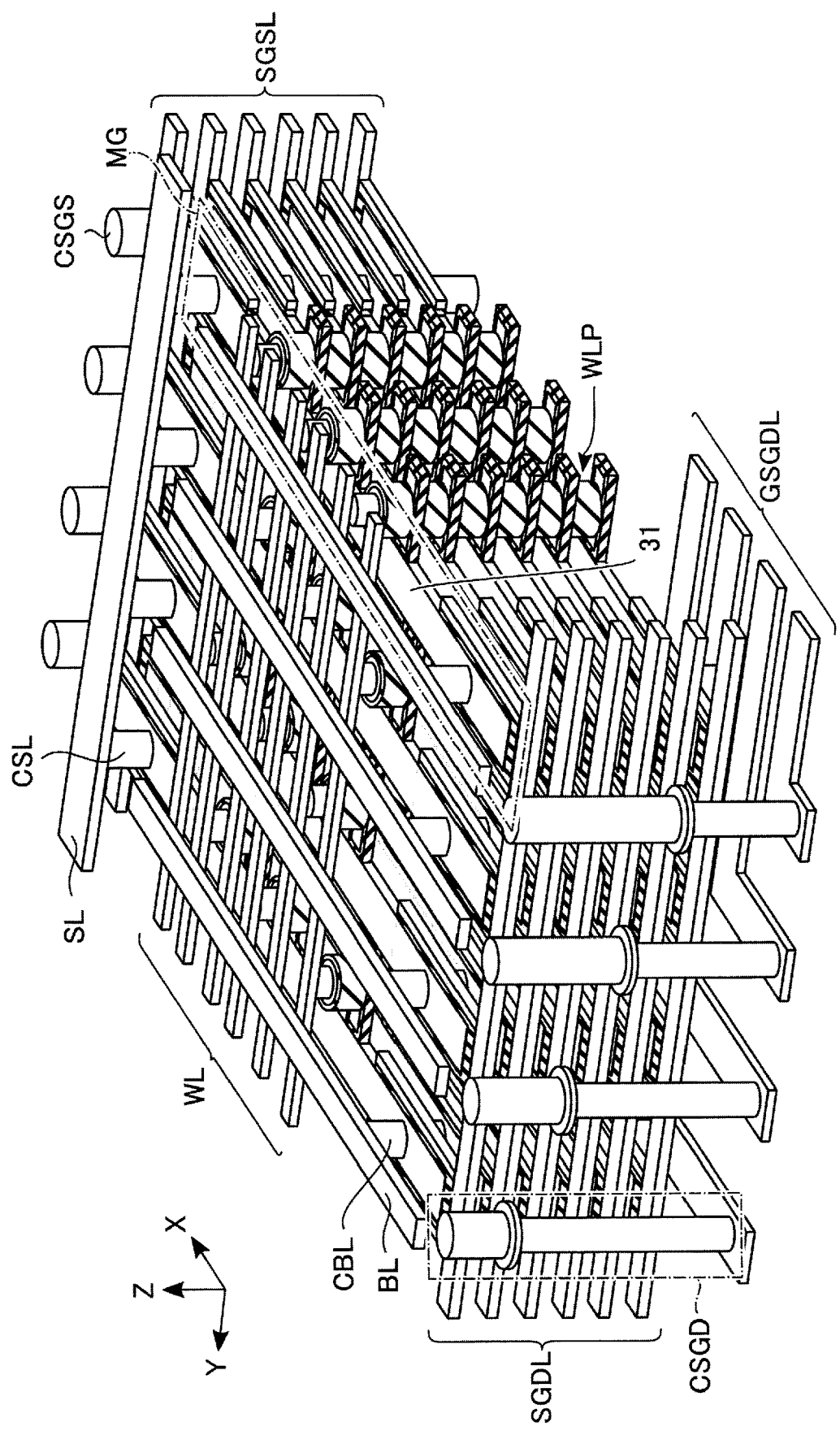
FIG. 2 is a perspective view of a memory cell array included in the semiconductor memory device according to the first embodiment.

In general, according to one embodiment, a semiconductor memory device includes: a first semiconductor layer including first to third portions which are arranged along a first direction and differ in position from one another in a second direction intersecting the first direction; a conductive layer including a fourth portion extending in the second direction and a fifth portion coupled to the fourth portion and extending in the first direction; a first insulating layer between the fourth portion and the first semiconductor layer and between the fifth portion and the first semiconductor layer; a first contact plug extending in a third direction intersecting the first direction and the second direction and coupled to the fourth portion; a second contact plug extending in the third direction and coupled to the first semiconductor layer in a region where the first insulating layer is formed; a first interconnect extending in the third direction; and a first memory cell apart from the fifth portion in the first direction and storing information between the semiconductor layer and the first interconnect.

1. First Embodiment

A semiconductor memory device according to a first embodiment will be described. As an example of the semiconductor memory device, a three-dimensional stacked NAND flash memory in which memory cell transistors are stacked three-dimensionally stacked above a semiconductor substrate, will be described below.

1.1. Configuration 1.1.1. Overall Configuration of Semiconductor Memory Device

First, the overall configuration of the semiconductor memory device will be described with reference to FIG. 1. FIG. 1 is a block diagram showing a basic example of the overall configuration of the semiconductor memory device.

In FIG. 1, some of the couplings between blocks are indicated by arrows. The couplings between blocks are not limited to those shown in FIG. 1.

As shown in FIG. 1, the semiconductor memory device 1 includes an input/output circuit 10, a logic controller 11, a status register 12, an address register 13, a command register 14, a sequencer 15, a ready/busy circuit 16, a voltage generator 17, a memory cell array 18, a row decoder 19, a sense amplifier 20, a data register 21, and a column decoder 22.

The input/output circuit 10 controls the input/output of a signal DQ to/from an external controller 2. The signal DQ includes, for example, data DAT, an address ADD, and a command CMD. More specifically, the input/output circuit 10 transmits data DAT received from the external controller 2 to the data register 21, transmits an address ADD to the address register 13 and transmits a command CMD to the command register 14. The input/output circuit 10 also transmits status information STS received from the status register 12, data DAT received from the data register 21, an address ADD received from the address register 13, and the like to the external controller 2.

The logic controller 11 receives various control signals from the external controller 2. Upon receiving a control signal, the logic controller 11 controls the input/output circuit 10 and the sequencer 15.

The status register 12 temporarily holds status information STS of, for example, a write operation, a read operation, and an erase operation and notifies the external controller 2 whether the operation is completed normally.

The address register 13 temporarily holds the received address ADD. Then, the address register 13 transfers the row address RADD to the row decoder 19 and transfers a column address CADD to the column decoder 22.

The command register 14 temporarily stores the received command CMD and transfers it to the sequencer 15.

The sequencer 15 controls the entire operation of the semiconductor memory device 1. More specifically, upon receiving a command CMD, the sequencer 15 controls the status register 12, ready/busy circuit 16, voltage generator 17, row decoder 19, sense amplifier 20, data register 21, column decoder 22, and the like to perform the write operation, the read operation, the erase operation, and the like.

The ready/busy circuit 16 transmits a ready/busy signal RBn to the external controller 2 in accordance with the operation status of the sequencer 15.

Under the control of the sequencer 15, the voltage generator 17 generates voltages for the write, read and, erase operations, and applies the generated voltage to the memory cell array 18, the row decoder 19, the sense amplifier 20 and the like. The row decoder 19, and the sense amplifier 20 apply voltages supplied from the voltage generator 17 to the memory cell transistors in the memory cell array 18.

The memory cell array 18 includes a plurality of blocks BLK (BLK0 to BLK3) each including a plurality of non-volatile memory cell transistors (also referred to as "memory cells" hereinafter) associated with the rows and columns. Each of the blocks BLK includes a plurality of memory units MU. Each of the memory units MU includes a plurality of memory groups MG. Note that the number of blocks BLK in the memory cell array 18, the number of memory units MU in each block BLK, and the number of memory groups MG in each memory unit MU are optional. The memory cell array 18 will be described in detail later.

The row decoder 19 decodes the row address RADD. Based on a result of the decoding, the row decoder 19 applies a necessary voltage to the memory cell array 18.

In the read operation, the sense amplifier 20 senses data read out of the memory cell array 18. Then, the sense amplifier 20 transmits the read data to the data register 21. In write operation, the sense amplifier 20 transmits write data to the memory cell array 18.

The data register 21 includes a plurality of latch circuits. The latch circuits temporarily hold write data or read data.

In the write operation, the read operation, the erase operation, etc., the column decoder 22 decodes the column address CADD, and selects a latch circuit in the data register 21 in accordance with a result of the decoding.

1.1.2. Overall Configuration of Memory Cell Array

The overall configuration of the memory cell array 18 will be described below with reference to FIG. 2. FIG. 2 is a perspective view of the memory cell array 18. In the example of FIG. 2, the insulating layers are partly omitted.

As shown in FIG. 2, the memory cell array 18 includes a plurality of semiconductor layers 31, a plurality of word line pillars WLP, a plurality of word lines WL, a plurality of select gate SGD and SGS, a plurality of contact plugs CSGD and CSGS, a plurality of select gate lines SGDL and SGSL, a plurality of global select gate lines GSGDL and GSGSL, a plurality of contact plugs CBL, a plurality of bit lines BL, a plurality of contact plugs CSL, and a source line SL.

The semiconductor layers 31 correspond to one memory group MG, which will be described later, and function as active areas where the channel layers of a plurality of memory cell transistors MC and select transistors ST1 and ST2 are formed. The semiconductor layers 31 extend in an X direction parallel to the semiconductor substrate and are stacked apart from each other (with an insulating layer (not shown) interposed between them) in a Z direction perpendicular to the semiconductor substrate. In each layer in the Z direction, the semiconductor layers 31 are arranged along a Y direction, which is parallel to the semiconductor substrate and intersects the X direction.

Between the semiconductor layers 31 arranged in the Y direction, the word line pillars WLP extend in the Z direction are arranged along the X direction. In other words, the word line pillars WLP arranged along the X direction and the semiconductor layers 31 stacked in the Z direction are alternated along the Y direction. The word lines WL are provided above the word line pillars WLP to extend in the Y direction. Between each semiconductor layer 31 and its corresponding word line pillar WLP, a block insulating film, a charge storage layer, and a tunnel insulating firm are provided.

One memory cell transistor MC is provided at a position where one word line pillar WLP intersects its corresponding semiconductor layer 31. The memory cell transistors MC are coupled in the X direction through the semiconductor layer 31. In other words, the channels of the memory cell transistors MC are coupled in the X direction.

Each of the contact plugs CBL is provided in a region close to one-end portions, in the X-direction, of the semiconductor layers 31 stacked in the Z direction to penetrate the semiconductor layers 31. Each contact plug CBL is coupled in common to the semiconductor layers 31 stacked in the Z direction. The contact plugs CBL are provided to correspond to the semiconductor layers 31 arranged along the Y direction. Each of the bit lines BL is provided above its corresponding contact plug CBL to extend in the X direction. The contact plugs CBL are coupled to different bit lines BL.

Each of the contact plugs CSL is provided in a region close to the other-end portions, in the X-direction, of the semiconductor layers 31 stacked in the Z direction to penetrate the semiconductor layers 31. Each contact plug CSL is coupled in common to the semiconductor layers 31 stacked in the Z direction. The contact plugs CSL are provided to correspond to the semiconductor layers 31 arranged along the Y direction. The source line SL is provided above the contact plugs CSL to extend in the Y direction. The contact plugs CSL are coupled in common to the source line SL.

The select gates SGD are respectively formed at the one-end portions, in which the contact plugs CBL are provided, of the semiconductor layers 31 arranged along the Y direction at each layer, via different insulating layers. The select gates SGD arranged at the same layer are commonly coupled to a select gate line SGDL extending in the Y direction. Accordingly, the semiconductor layers 31 and the select gate lines SGDL are not electrically coupled to each other. Similarly, the select gates SGS are respectively formed at the other-end portions, in which the contact plugs CSL are provided, of the groups of semiconductor layers 31, via different insulating layers. The select gates SGS arranged at the same layer commonly coupled to a select gate line SGSL extending in the Y direction. Accordingly, the semiconductor layers 31 and the select gate line SGSL are not electrically coupled to each other. The select gate lines SGDL and SGSL are stacked in such a manner that each of the select gate lines SGDL and SGSL is arranged at the same layer as the corresponding semiconductor layers 31 stacked in the Z direction.

The global select gate lines GSGDL are formed along the XY plane, below the semiconductor layers 31 stacked in the Z direction and the select gate lines SGDL.

At the intersection of the select gate line SGDL and the global select gate lines GSGDL, the corresponding contact plug CSGD is provided to extend in the Z direction. The contact plugs CSGD are arranged along the Y direction. Each of the contact plugs CSGD includes a coupling portion that is electrically coupled to one of the select gate lines SGDL. That is, each of the contact plugs CSGD electrically couples its corresponding global select gate line GSGDL and its corresponding select gate line SGDL. In the example of FIG. 2, the coupling portions of the contact plugs CSGD arranged along the Y direction are coupled to the select gate lines SGDL of the respective layers.

The global select gate lines GSGSL (not shown in FIG. 2) are formed along the XY plane, below the semiconductor layers 31 stacked in the Z direction and the select gate lines SGSL.

At the intersection of the select gate line SGSL and the global select gate lines GSGSL, the corresponding contact plug CSGS is provided to extend in the Z direction. The contact plugs CSGS are arranged along the Y direction. Each of the contact plugs CSGS includes a coupling portion that is electrically coupled to one of the select gate lines SGSL. That is, each of the contact plugs CSGS electrically couples its corresponding global select gate line GSGSL and its corresponding select gate line SGSL.

A plurality of memory groups MG (semiconductor layers 31) arranged along the Y direction and corresponding to one select gate line SGDL and one select gate line SGSL, are included in one memory unit MU. Furthermore, a plurality of memory units MU coupled in common to word line pillars WLP are included in one block BLK.

1.1.3. Circuit Configuration of Memory Cell Array

Figure 4:
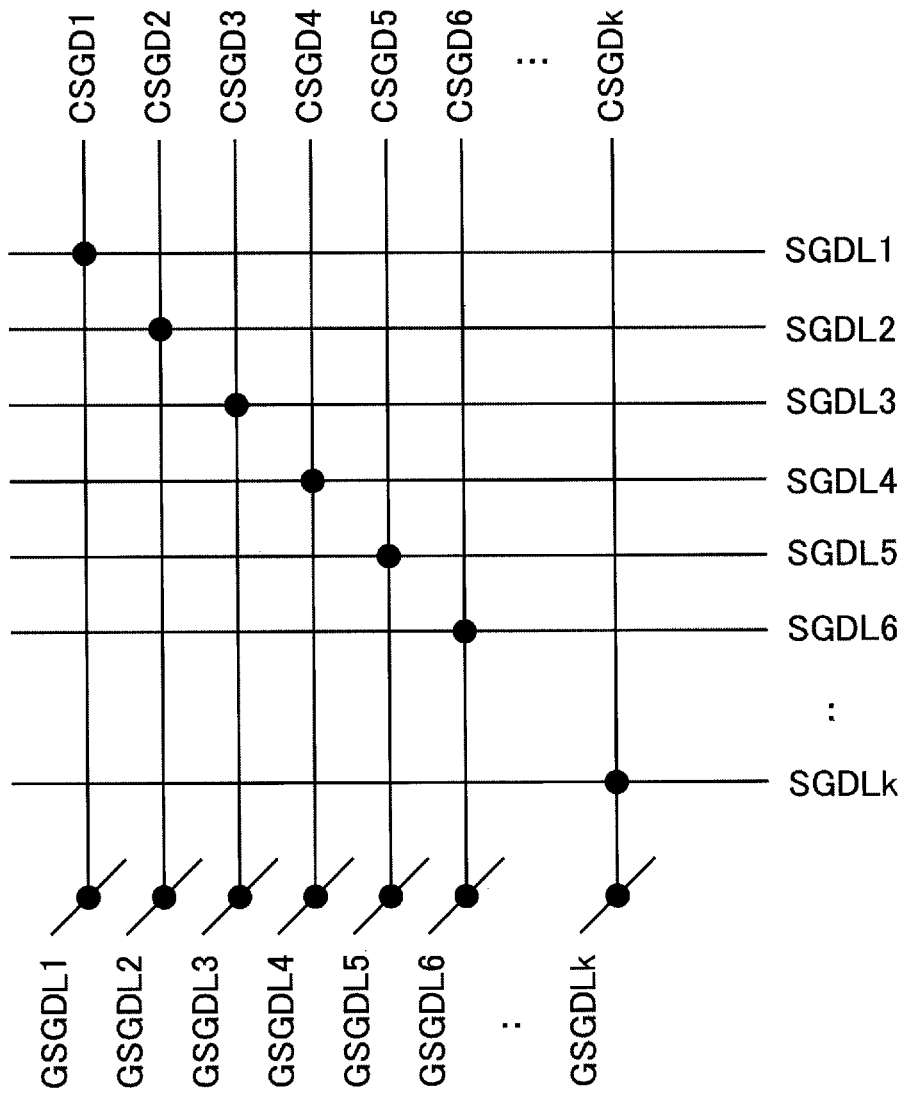
FIG. 4 is a circuit diagram showing coupling of select gate lines SGDL in the memory cell array included in the semiconductor memory device according to the first embodiment.
Figure 5:
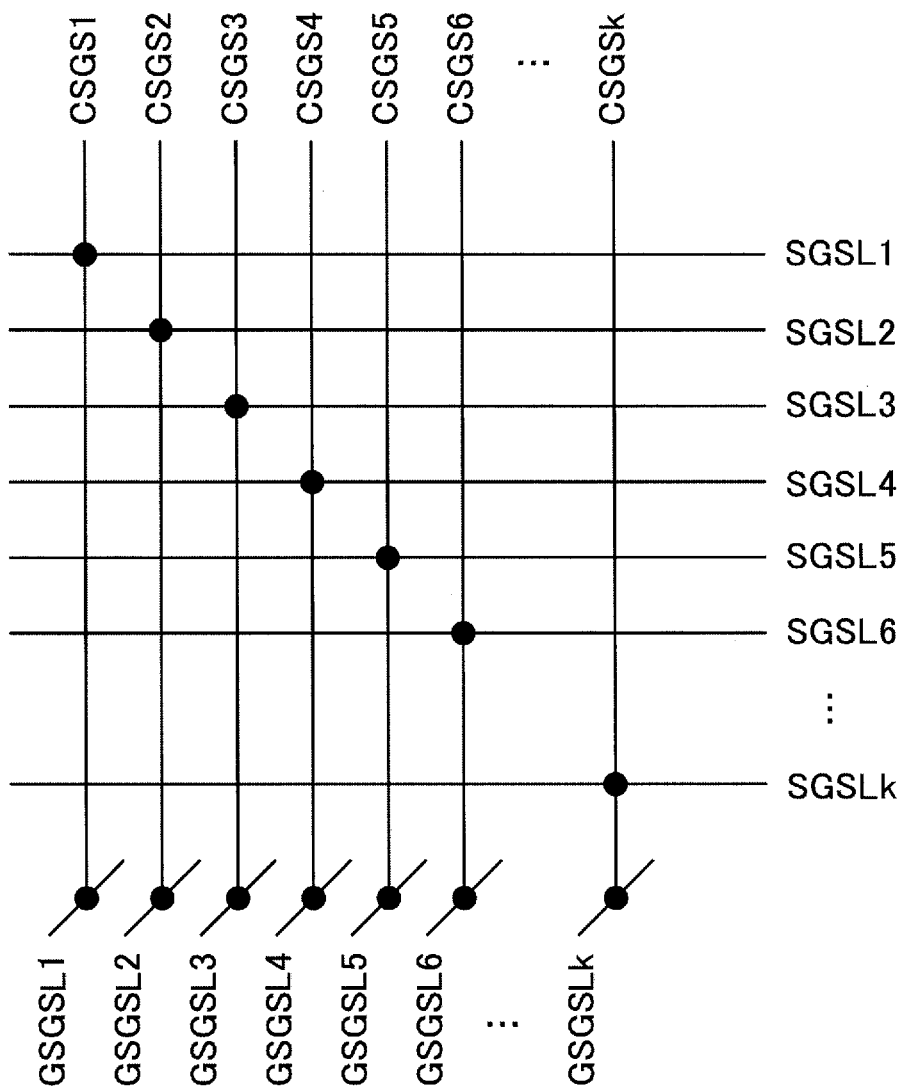
FIG. 5 is a circuit diagram showing coupling of select gate lines SGSL in the memory cell array included in the semiconductor memory device according to the first embodiment.

The circuit configuration of the memory cell array 18 will be described below with reference to FIGS. 3 to 5. FIG. 3 is a circuit diagram of the memory cell array 18. FIG. 4 a circuit diagram showing coupling between the select gate lines SGDL and the global select gate lines GSGDL. FIG. 5 is a circuit diagram showing coupling between the select gate lines SGSL and the global select gate lines GSGSL. The example of FIG. 3 shows a plurality of memory groups MG corresponding to a plurality of semiconductor layers 31 which are stacked in the Z direction and coupled in common to one contact plug CBL. The example of FIG. 4 shows contact plugs CSGD and global select gate lines GSGDL coupled to their respective select gate lines SGDL stacked in the Z direction. The example of FIG. 5 shows contact plugs CSGS and global select gate lines GSGSL coupled to their respective select gate lines SGSL stacked in the Z direction. Hereinafter, the select gate lines corresponding to the uppermost semiconductor layers 31 (memory group MG) will be represented as SGDL1 and SGSL1, and the select gate lines corresponding to the lowermost semiconductor layers 31 (memory group MG) will be represented as SGDLk and SGSLk (k is an integer of 2 or more).

As shown in FIG. 3, the memory cell array 18 includes a plurality of memory groups MG. Each of the memory groups MG includes two memory strings MSa and MSb and select transistors ST1 and ST2. Hereinafter, the memory strings will be referred to as memory strings MS unless they are limited to the memory strings MSa and MSb.

The memory string MSa includes, for example, four memory cell transistors MCa0 to MCa3. Similarly, the memory string MSb includes, for example, four memory cell transistors MCb0 to MCb3. Hereinafter, the memory cell transistors will be referred to as memory cell transistors MC unless they are not limited to the memory cell transistors MCa0 to MCa3 and MCb0 to MCb3.

The memory cell transistors MC each include a control gate and a charge storage layer to hold data in a non-volatile manner. The memory cell transistors MC may be a MONOS type using a dielectric film as the charge storage layer or a floating gate (FG) type using a conductive film as the charge storage layer. The number of memory cell transistors MC included in each of the memory strings MS may be 8, 16, 32, 48, 64, 96, 128 or the like, and is not limited.

The current paths of the memory cell transistors MCa0 to MCa3 included in the memory string MSa are coupled in series. Similarly, the current paths of the memory cell transistors MCb0 to MCb3 included in the memory string MSb are coupled in series. The drains of the memory cell transistors MCa0 and MCb0 are coupled in common to the source of the select transistor ST1. The sources of the memory cell transistors MCa3 and MCb3 are coupled in common to the drain of the select transistor ST2. The number of select transistors ST1 included in the memory group MG is optional and the number of select transistors ST2 included therein is also optional, and each number has only to be one or more.

The gates of the memory cell transistors MC of the memory groups MG arranged along the Z direction are coupled in common to one word line WL via their respective word line pillars WLP. More specifically, for example, the gates of the memory cell transistors MCa0 arranged along the Z direction are coupled in common to the word line WLa0. Similarly, the gates of the memory cell transistors MCa1, MCa2, and MCa3 are coupled to the word lines WLa1, WLa2, and WLa3, respectively. The gates of the memory cell transistors MCb0 to MCb3 are coupled to the word lines WLb0 to WLb3, respectively.

The drains of the select transistors ST1 of the memory groups MG arranged along the Z direction are commonly coupled to one bit line BL via the respective contact plug CBL. The select gates SGD of the select transistors ST1 of the memory groups MG arranged along the Z direction are coupled to different select gate lines SGDL. More specifically, for example, the select gate SGD (SGD1) of, for example, the select transistor ST1 corresponding to the memory group MG arranged at the uppermost layer is coupled to the select gate line SGDL1. The select gate SGD (SGDk) of the select transistor ST1 corresponding to the memory group MG arranged at the lowermost layer is coupled to the select gate line SGDLk.

The sources of the select transistors ST2 of the memory groups MG arranged along the Z direction are commonly coupled to one source line SL via the respective contact plug CSL. The select gates SGS of the select transistors ST2 of the memory groups MG arranged along the Z direction are coupled to different select gate lines SGSL. More specifically, the select gate SGS (SGS1) of the select transistor ST2 corresponding to the memory group MG arranged at the uppermost layer is coupled to the select gate line SGSL1, and the select gate SGS (SGSk) of the select transistor ST2 corresponding to the memory group MG arranged at the lowermost layer is coupled to the select gate line SGSLk.

Next is a description of coupling between the select gate lines SGDL and contact plugs CSGD and the global select gate lines GSGDL. Hereinafter, the contact plugs CSGD corresponding to their respective select gate lines SGDL1 to SGDLk stacked in the Z direction will be represented as CSGD1 to CSGDk, and the global select gate lines GSGDL will be represented as GSGDL1 to GSGDLk.

As shown in FIG. 4, the select gate line SGDL1 is coupled to the global select gate line GSGDL1 via the contact plug CSGD1. The same is true of the other select gate lines SGDL. That is, the select gate lines SGDL stacked in the Z direction are coupled to different global select gate lines GSGDL via different contact plugs CSGD.

Next is a description of coupling between the select gate lines SGSL and contact plugs CSGS and the global select gate lines GSGSL. Hereinafter, the contact plugs CSGS corresponding to their respective select gate lines SGSL1 to SGSLk stacked in the Z direction will be represented as CSGS1 to CSGSk, and the global select gate lines GSGSL will be represented aSGSLGS1 to GSGSLk.

As shown in FIG. 5, the select gate line SGSL1 is coupled to the global select gate line GSGSL1 via the contact plug CSGS1. The same is true of the other select gate lines SGSL. That is, the select gate lines SGSL stacked in the Z direction are coupled to different global select gate lines GSGSL via different contact plugs CSGS.

1.1.4. Plane Configuration of Memory Cell Array

Next is a description of an example of a plane configuration of the memory cell array 18.

1.1.4.1. Layout of Semiconductor Layers and Select Gate Lines

First, the layout of the uppermost semiconductor layers 31 and the select gate lines SGDL and SGSL will be described with reference to FIG. 6. FIG. 6 is a top view of the uppermost semiconductor layers 31 and the select gate lines SGDL and SGSL. In the example of FIG. 6, the insulating layers are partly omitted.

As shown in FIG. 6, the memory cell array 18 includes a memory cell region, an SGD region, an SGS region, a select gate contact region corresponding to the select gate lines SGDL, and a select gate contact region corresponding to the select gate lines SGSL. The memory cell transistors MC are provided in the memory cell region, that is, the word line pillars WLP are arranged in in the memory cell region. The SGD region is provided adjacent to one end of the memory cell region in the X direction, and functions as a coupling area between the semiconductor layers 31 and the contact plugs CBL. The select transistors ST1, are provided in the SGD region. The SGS region is provided adjacent to the other one end of the memory cell region in the X direction, and functions as a coupling area between the semiconductor layers 31 and the contact plugs CSL. The select transistors ST2 is provided in the SGS region. The select gate contact region corresponding to the select gate lines SGDL in provided adjacent to the SGD region in the X direction and couples the contact plugs CSGD and the select gate lines SGDL. The select gate contact region corresponding to the select gate lines SGSL is provided adjacent to the SGS region in the X direction and couples the contact plugs CSGS and the select gate lines SGSL. The number of memory cell regions included in the memory cell array 18, the number of SGD regions included therein, the number of SGS regions included therein, the number of select gate contact regions corresponding to the select gate lines SGDL, and the number of select gate contact regions corresponding to the select gate lines SGSL are each optional.

In the memory cell region, a plurality of (12 in the example of FIG. 6) semiconductor layers 31 extend in the X direction and arranged along the Y direction. Between two semiconductor layers 31, a plurality of (12 in the example of FIG. 6) word line pillars WLP are arranged along the X direction. The word line pillars WLP are also arranged in a staggered fashion in the Y direction. For example, the word line pillars WLP1 and WLP2 are arranged adjacent to each other in the X direction, the word line pillar WLP3 is placed between the word line pillars WLP1 and WLP2 in the X direction, and the word line pillars WLP1 and WLP2 are arranged at different positions in the Y direction.

In the example of FIG. 6, of the 12 word line pillars WLP arranged along the X direction between two semiconductor layers 31, two word line pillars WLP arranged at either end correspond to dummy memory cell transistors DMC (also referred to as "dummy cells" hereinafter). In other words, two dummy memory cell transistor DMC, eight memory cell transistors MC, and two dummy memory cell transistors DMC are arranged in this order along the X direction. For example, the dummy memory cell transistors DMC are used to electrically couple the channel regions of memory cell transistors MC formed in the semiconductor layers 31 in the memory cell region and the select transistors ST1 and ST2 formed in the semiconductor layers 31 in the SGD and SGS regions. Note that the number of dummy memory cell transistors DMC is optional and may be zero.

In the SGD region, a select gate SGD is provided on the side of each of the semiconductor layers 31 with a gate oxide film therebetween (which will be described in detail later).

Furthermore, a plurality of (12 in the example of FIG. 6) contact plugs CBL are coupled to their respective semiconductor layers 31 arranged along the Y direction. In the example of FIG. 6, the contact plugs CBL are staggered in four lines (columns) along the Y direction. In other words, a four-line pattern in which four contact plugs CBL adjacent in the Y direction are arranged with their positions varying in the X direction, is repeated in the Y direction.

The four-line staggered arrangement will be described. For example, the contact plugs CBL1 to CBL4 are arranged with their positions shifted in sequence in the X direction. More specifically, the contact plug CBL2 adjacent to the contact plug CBL1 is provided at a position different from the contact plug CBL1 in the X direction. The contact plug CBL3 adjacent to the contact plug CBL2 is provided at a position different from the contact plugs CBL1 and CBL2 in the X direction. Similarly, the contact plug CBL4 adjacent to the contact plug CBL3 is provided at a position different from the contact plugs CBL1, CBL2, and BL3 in the X direction.

In this case, the contact plugs CBL1 to CBL4 are arranged such that the distance between the contact plugs CBL1 and CBL2, the distance between the contact plugs CBL2 and CBL3 and the distance between the contact plugs CBL3 and CBL4, for example, in the X direction, are substantially the same.

The above-described four-line staggered arrangement is repeated in the Y direction. For example, the contact plug CEL5 adjacent to the contact plug CBL4 in the Y direction is placed in the same position as the contact plug CBL1 in the X direction.

In the four-line staggered arrangement, the positions of the contact plugs CBL1 to CBL4 in the X direction are optional. For example, the contact plugs CBL1 to CBL4 need not be arranged at regular intervals in the X direction, but may be arranged in different order in the X direction. The arrangement of the contact plugs CBL is not limited to the four-line staggered arrangement. For example, the contact plugs CBL may be arranged in line along the Y direction and may be staggered in two or more lines.

In the SGS region, a select gate SGS is provided on the side of each of the semiconductor layers 31 with a gate oxide film therebetween (which will be described in detail later).

In addition, two semiconductor layers 31 adjacent along the Y direction are bundled into one and coupled in common to one contact plug CSL. In the example of FIG. 6, two semiconductor layers 31 are coupled in common to one contact plug CSL; however, the semiconductor layers 31 and the contact plugs CSL are not limited to this configuration. For example, one contact plug CSL may be provided for one semiconductor layer 31, and three or more semiconductor layers 31 may be bundled and coupled in common to one contact plug CSL.

In the select gate contact region corresponding to the select gate lines SGDL, a plurality of contact plugs CSGD are provided along the Y direction. The contact plugs CSGD penetrate the select gate lines SGDL stacked in the Z direction and electrically coupled to one of the select gate lines SGDL.

Furthermore, in the select gate contact region corresponding to the select gate lines SGDL, a plurality of dummy pillars HR that penetrate the select gate lines SGDL stacked in the Z direction are provided. The arrangement of the dummy pillars HR is optional. The dummy pillars HR are formed of insulating layers and are not electrically coupled to the other interconnect. The dummy pillars HR function as pillars for supporting the insulating layers when a gap is formed in an etching step.

Similarly, in the select gate contact region corresponding to the select gate lines SGSL, a plurality of contact plugs CSGS are provided along the Y direction. The contact plugs CSGS penetrate the select gate lines SGSL stacked in the Z direction and is electrically coupled to one of the select gate lines SGSL.

Furthermore, in the select gate contact region corresponding to the select gate lines SGSL, a plurality of dummy pillars HR that penetrate the select gate lines SGSL stacked in the Z direction are provided, like the select gate contact region corresponding to the select gate lines SGDL.

1.1.4.2. Layout of Word Lines and Source Lines

Figure 7:
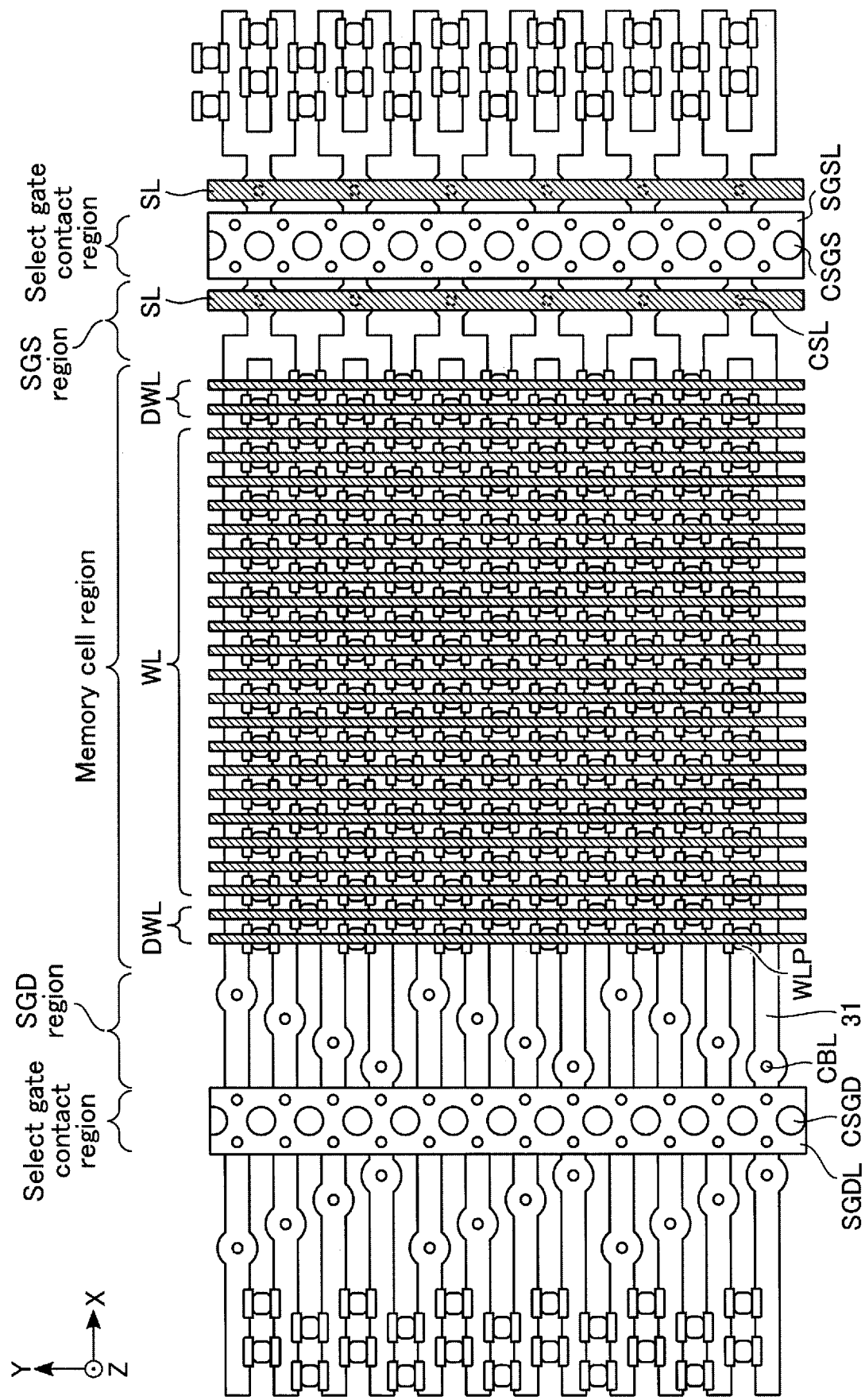
FIG. 7 is a top view of word lines and source lines in the memory cell array included in the semiconductor memory device according to the first embodiment.

Next is a description of the layout of the word lines WL and source lines SL. FIG. 7 is a top view of the word lines WL and source lines SL. In the example of FIG. 7, the word lines WL and source lines SL are formed on the same layer. In the example of FIG. 7, the insulating layers are partly omitted.

As illustrate in FIG. 7, in the memory cell region, a plurality of (24 in the example of FIG. 7) word lines WL extend in the Y direction and are arranged along the X direction. The word lines WL are provided above the word line pillars WLP and are electrically coupled to the word line pillars WLP provided therebelow. In the example of FIG. 7, the pitch (spacing) between two word lines WL in the X direction is ½ of the pitch between two word line pillars WLP arranged along the X direction. Note that the pitch between the word lines WL can optionally be set. For example, the pitch between the word lines WL may be ¼ of the pitch between the word line pillars WLP.

Furthermore, in the case of FIG. 7, of the 24 words line WL, a total of four word lines including two word lines arranged at either end correspond to dummy word lines DWL. The number of dummy word lines DWL is optional, as is the arrangement thereof. For example, the number of dummy word lines DWL may be zero.

In the SGS region, a source line SL is provided to extend in the Y direction. The source line SL is provided on the contact plugs CSL and electrically coupled to the contact plugs CSL provided therebelow.

1.1.4.3. Layout of Bit Lines

Figure 8:
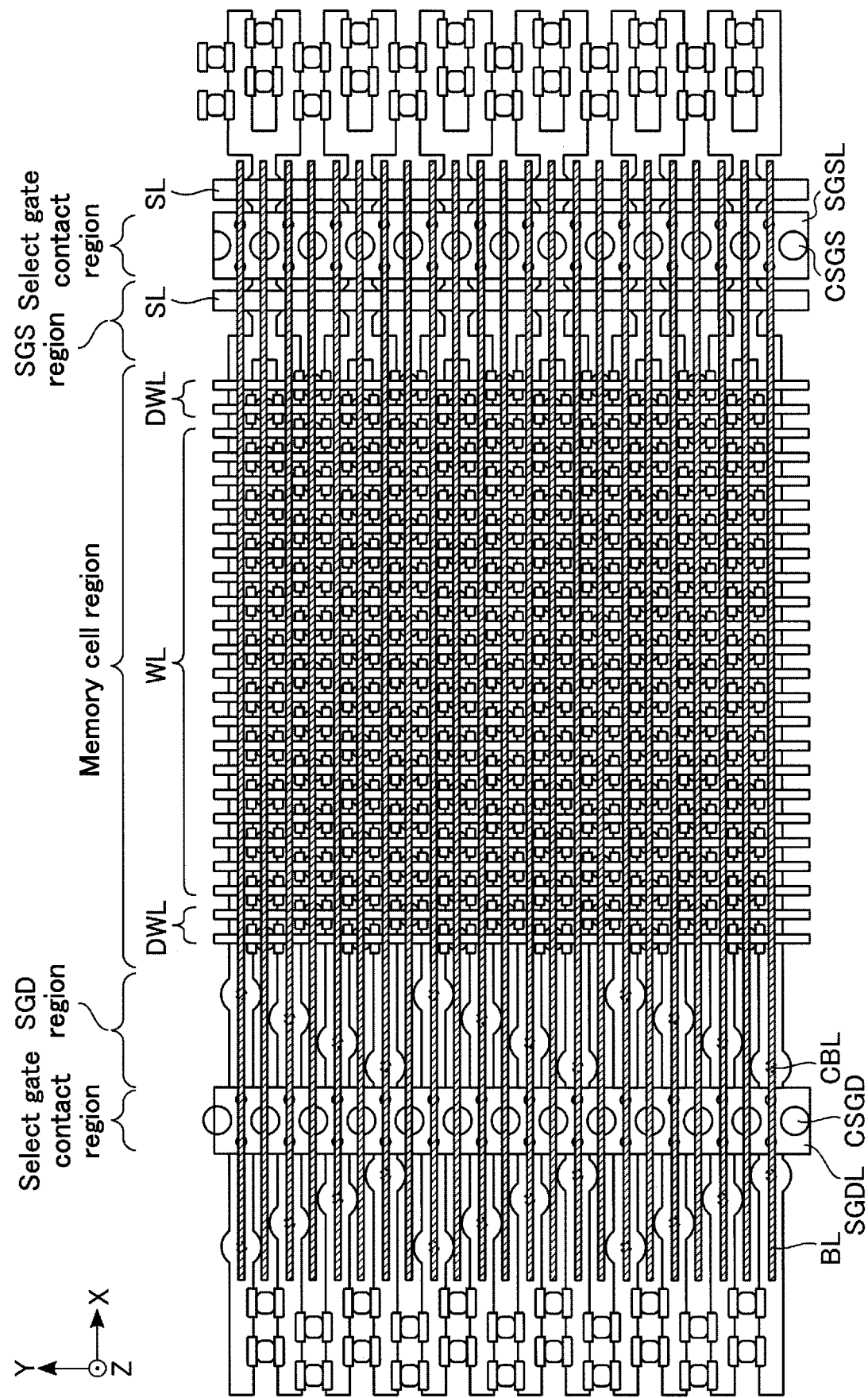
FIG. 8 is a top view of bit lines in the memory cell array included in the semiconductor memory device according to the first embodiment.

The layout of bit lines BL will be described with reference to FIG. 8. FIG. 8 is a top view of the bit lines BL. In the example of FIG. 8, the bit lines BL are provided above the word lines WL and the source lines SL. In the example of FIG. 8, the insulating layers are partly omitted.

As illustrate in FIG. 8, a plurality of (23 in the example of FIG. 8) bit lines BL extend in the X direction and are arranged along the Y direction above the word lines WL and the source lines SL. The bit lines BL are provided on the contact plugs CBL and are electrically coupled to the contact plugs CBL provided therebelow. In the example of FIG. 8, the pitch (spacing) between two bit lines BL in the Y direction is ½ of the pitch between two contact plugs CBL arranged in the Y direction. Note that the pitch between the bit lines BL can optionally be set. For example, the pitch between the bit lines BL may be ¼ of the pitch between the contact plugs CBL.

1.1.4.4 Layout of Global Select Gate Lines

Figure 9:
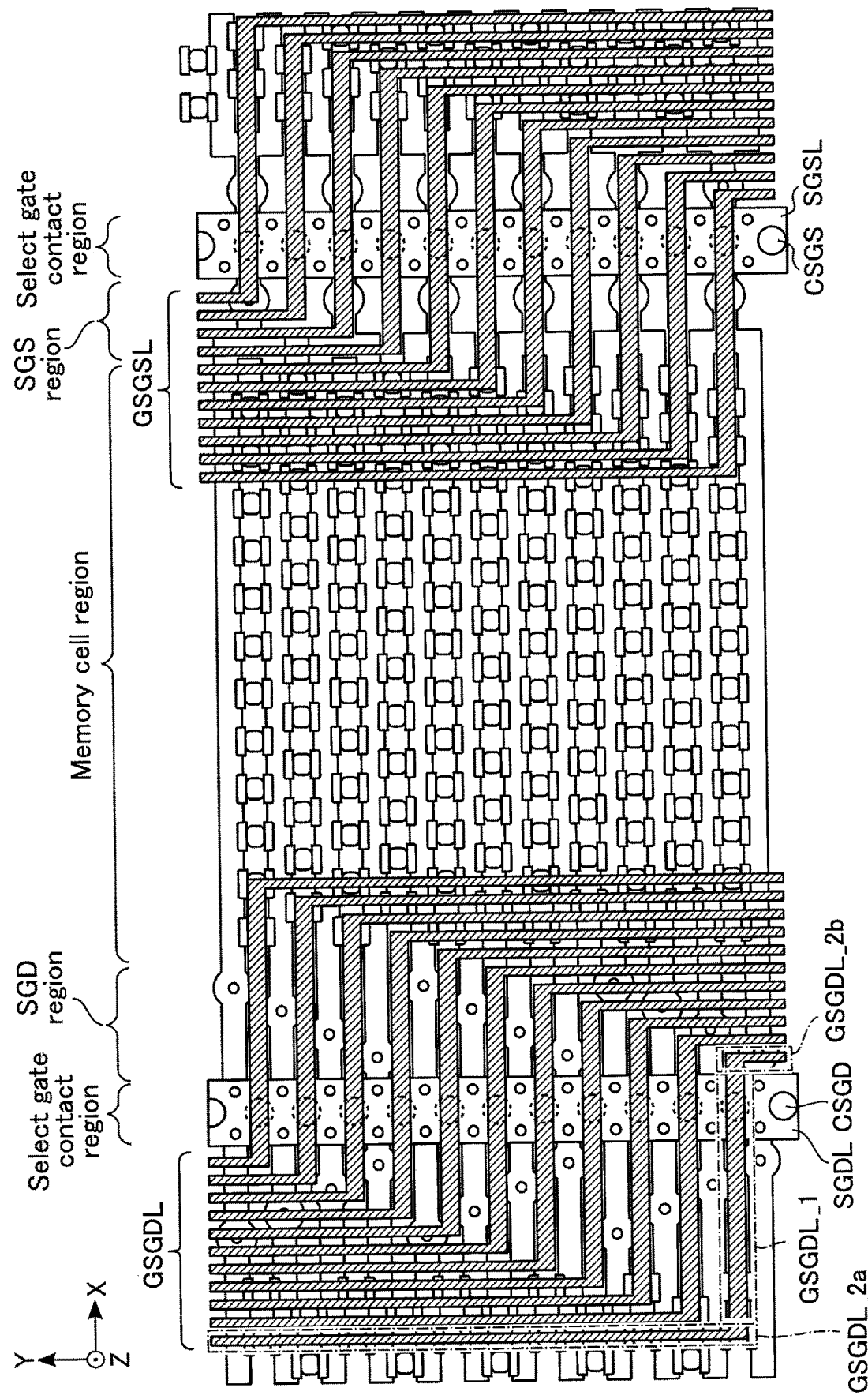
FIG. 9 is a schematic diagram showing global select gate lines in the memory cell array included in the semiconductor memory device according to the first embodiment.

The layout of the global select gate lines GSGDL and GSGSL will be described with reference to FIG. 9. FIG. 9 is a schematic diagram showing the arrangement of the global select gate lines GSGDL and GSGSL in the memory cell array 18. For example, the global select gate lines GSGDL and GSGSL are provided on the lowermost layer of the memory cell array 18. In the example of FIG. 9, the insulating layers are partly omitted.

As shown in FIG. 9, each of the global select gate lines GSGDL includes a first portion GSGDL_1 extending in the X direction and coupled to the corresponding contact plug CSGD, and two second portions GSGDL_2a and GSGDL_2b coupled to the respective ends of the first portion GSGDL_1 and extending in the Y direction. More specifically, each global select gate line GSGDL includes a second portion GSGDL_2a coupled to one end of the first portion GSGDL_1 and extending in the Y direction (upward direction as viewed in FIG. 9), and a second portion GSGDL_2b coupled to the other end of the first portion GSGDL_1 and extending in the Y direction (downward direction as viewed in FIG. 9). In other words, the global select gate lines GSGDL extending in the Y direction are bent in the X direction, and are coupled to the respective contact plugs CSGD. After being coupled to the contact plug CSGD, the global select gate lines GSGDL are bent and extend in the Y direction (this shape will be referred to as "crank shape" hereinafter).

In the global select gate lines GSGDL, the first portions GSGDL_1 are arranged along the Y direction, and the second portions GSGDL_2a and GSGDL_2b are arranged along the X direction.

The same is true of the global select gate lines GSGSL.

Figure 10:
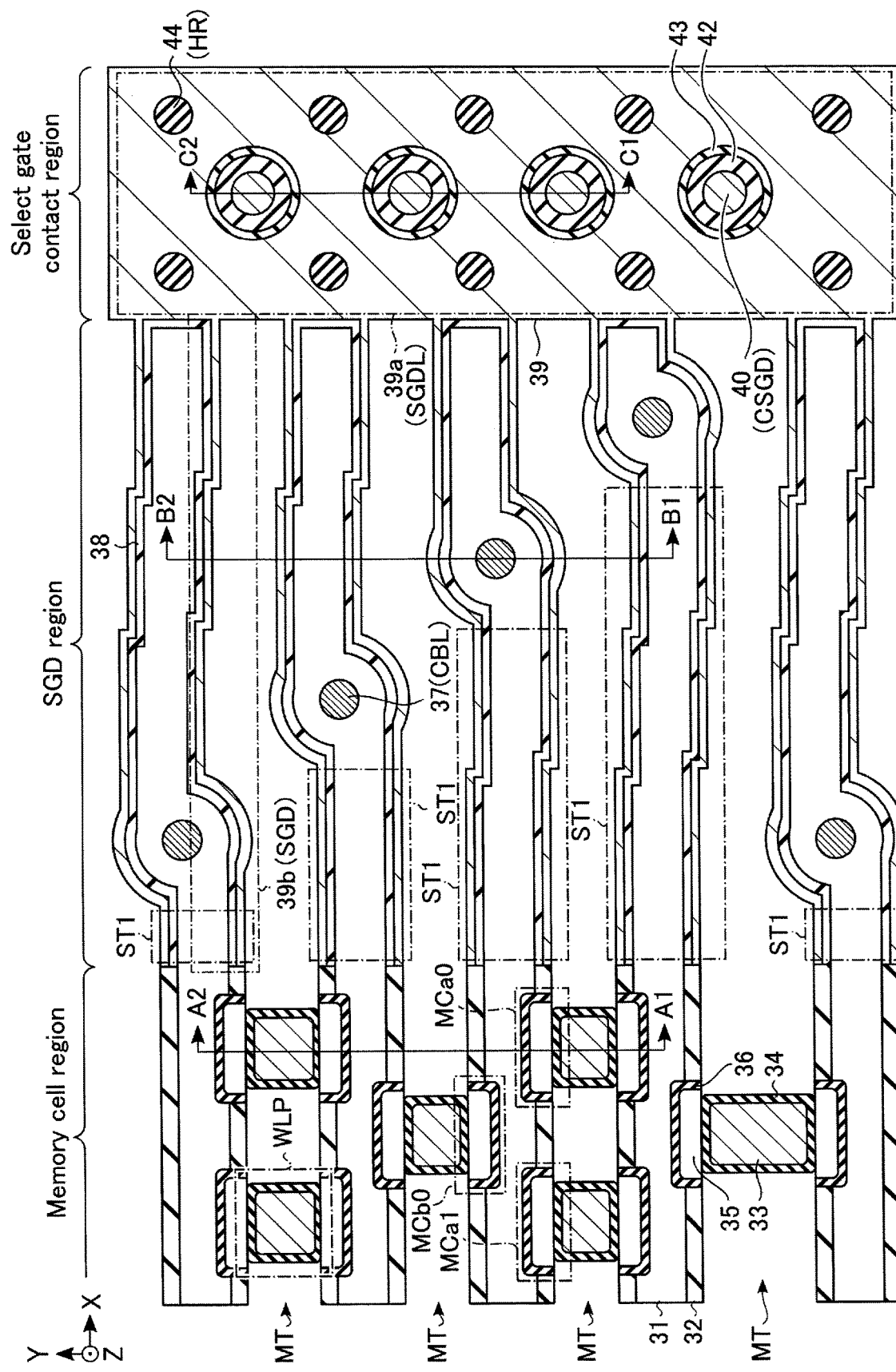
FIG. 10 is an enlarged view of a region RA shown in FIG. 6.

1.1.4.5. Details of Memory Cell Region, SGD Region, and Select Gate Contact Region The plane configuration of the memory cell array 18 in the memory cell region, the SGD region, and the select gate contact region corresponding to the select gate lines SGDL will be described in detail with reference to FIG. 10. FIG. 10 is an enlarged view of the region RA shown in FIG. 6. In the example of FIG. 10, the insulating layers are partly omitted, and the dummy memory cell transistors DMC are omitted in order to simplify the description.

As shown in FIG. 10, a memory trench MT is provided between two semiconductor layers 31 arranged along the Y direction. The memory trench MT is embedded by an insulating layer (not shown).

In the memory cell region, an insulating layer 32 is provided on either side of each semiconductor layer 31. The insulating layer 32 functions as an etching stopper in forming an insulating layer 36 (tunnel insulating film) and a charge storage layer 35.

In the memory cell region, furthermore, a plurality of word line pillars WLP are provided so as to separate the memory trench MT. The word line pillars WLP each include a conductive layer 33 extending in the Z direction and an insulating layer 34 that is in contact with the side of the conductive layer 33. The insulating layer 34 functions as a block insulating film of the memory cell transistor MC.

In the Y direction, between the word line pillar WLP and the semiconductor layer 31, a charge storage layer 35 and an insulating layer 36 are provided so as to separate the insulating layer 32. The insulating layer 36 functions as a tunnel insulating film. More specifically, in the XY plane, one side of the charge storage layer 35 along the X direction is in contact with the insulating layer 34 of the word line pillar WLP, and the other side (the other sides along the X direction and two sides along the Y direction) is in contact with the insulating layer 36. The side of the insulating layer 36 is partly in contact with the semiconductor layer 31 and the insulating layer 32.

Therefore, between the conductive layer 33 and the semiconductor layer 31, the insulating layer 34, the charge storage layer 35, and the insulating layer 36 are formed in order toward the semiconductor layer 31 from the conductive layer 33. A region including part of the semiconductor layer 31, part of the conductive layer 33, part of the insulating layer 34, the charge storage layer 35, and the insulating layer 36 (also referred to as an intersection area between the semiconductor layer 31 and the word line pillar WLP) functions as a memory cell transistor MC. In the example of FIG. 10, an intersection area between one semiconductor layer 31 and a word line pillar WLP provided on the lower side of FIG. 10 functions as a memory cell transistor MCa, and an intersection area between one semiconductor layer 31 and a word line pillar WLP provided on the upper side of FIG. 10 functions as a memory cell transistor MCb. In addition, for example, a plurality of memory cell transistors MCa corresponding to one semiconductor layer 31 will be represented as MCa0, MCa1, . . . in order toward the SGS region from the SGD region. The same is true of a plurality of memory cell transistors MCb.

In the SGD region, a conductive layer 37 is provided to penetrate its corresponding semiconductor layer 31. The conductive layer 37 functions as a contact plug CBL. In the example of FIG. 10, the semiconductor layer 31 is shaped like a circle in a coupling area between the semiconductor layer 31 and the conductive layer 37. Note that the shape of the semiconductor layer 31 in the coupling area between the semiconductor layer 31 and the conductive layer 37 is optional. For example, the shape of the coupling area may be a polygon. The coupling area has only to be shaped and sized such that a sufficient margin can be secured on the XY plane to prevent a hole of a contact plug CBL from protruding from the semiconductor layer 31 due to variations in manufacturing or the like when the hole of the contact plug CBL is processed to penetrate the semiconductor layer 31.

In the SGD region, an insulating layer 38 is formed so as to surround the side of each semiconductor layer 31, or so as to be in contact with the end of each semiconductor layer 31 in the X direction and the side of the semiconductor layer 31 in the Y direction. The insulating layer 38 functions as a gate insulating film of the select transistor ST1. One side of the insulating layer 38, which is opposed to the other side that is in contact with the semiconductor layer 31, is in contact with a conductive layer 39.

The conductive layer 39 includes a first portion 39a and a plurality of second portions 39b. The first portion 39a functions as a select gate line SGDL and extends in the Y direction and. Each of the plurality of second portions 39b functions as the select gate SGD, extends in the X direction in the SGD region, is in contact with the insulating layer 38 on one side along the X direction, and is coupled at one end to the first portion 39a. Hereinafter, the conductive layer 39 is represented as conductive layer 39a when it is limited to the first portion, and it is represented as conductive layer 39b when it is limited to the second portion.

The semiconductor layers 31, insulating layers 38, and conductive layers 39b in the SGD region extend stepwise in the X direction. In other words, the semiconductor layers 31, insulating layers 38, and conductive layers 39b extend in the X direction with their positions varying in the Y direction. Note that, the semiconductor layers 31, insulating layers 38, and conductive layers 39b may curve and extend in the X direction. Thus, the semiconductor layers 31, insulating layers 38, and conductive layers 39b are so arranged in the SGD region that there is an interval longer than a preset one between adjacent semiconductor layers 31, adjacent insulating layers 38, and adjacent conductive layers 39b in the Y direction and they become the closest to each other in the Y direction. The layout of the semiconductor layers 31 in the SGD region will be described in detail later.

In the SGD region, a region including the semiconductor layer 31 from the memory cell region to the conductive layer 37, the insulating layer 38, and the conductive layer 39b functions as a select transistor ST1. More specifically, the conductive layer 39b functions as a gate electrode of the select transistor ST1, the insulating layer 38 functions as a gate insulating film of the select transistor ST1, and a channel of the select transistor ST1 is formed in the semiconductor layer 31. Accordingly, the select transistors ST1 corresponding to the contact plugs CBL, arranged in four rows, differ in gate length However, the distance from the memory cell region to the contact plug CBL is set such that the gate length of the select transistor ST1 is not smaller than the minimum value that depends upon the device characteristics.

In the select gate contact region, a conductive layer 40 and an insulating layer 44 are formed to penetrate the conductive layer 39a. The conductive layer 40 functions as a contact plug CSGD. The insulating layer 44 functions as a dummy pillar HR. The conductive layer 40 is electrically coupled to any one of the conductive layers 39a stacked in the Z direction. The insulating layer 42 is formed in contact with the side (also referred to as "outer surface" hereinafter) of the conductive layer 40. The insulating layer 43 is formed in contact with the outer surface of the insulating layer 42.

Figure 11:
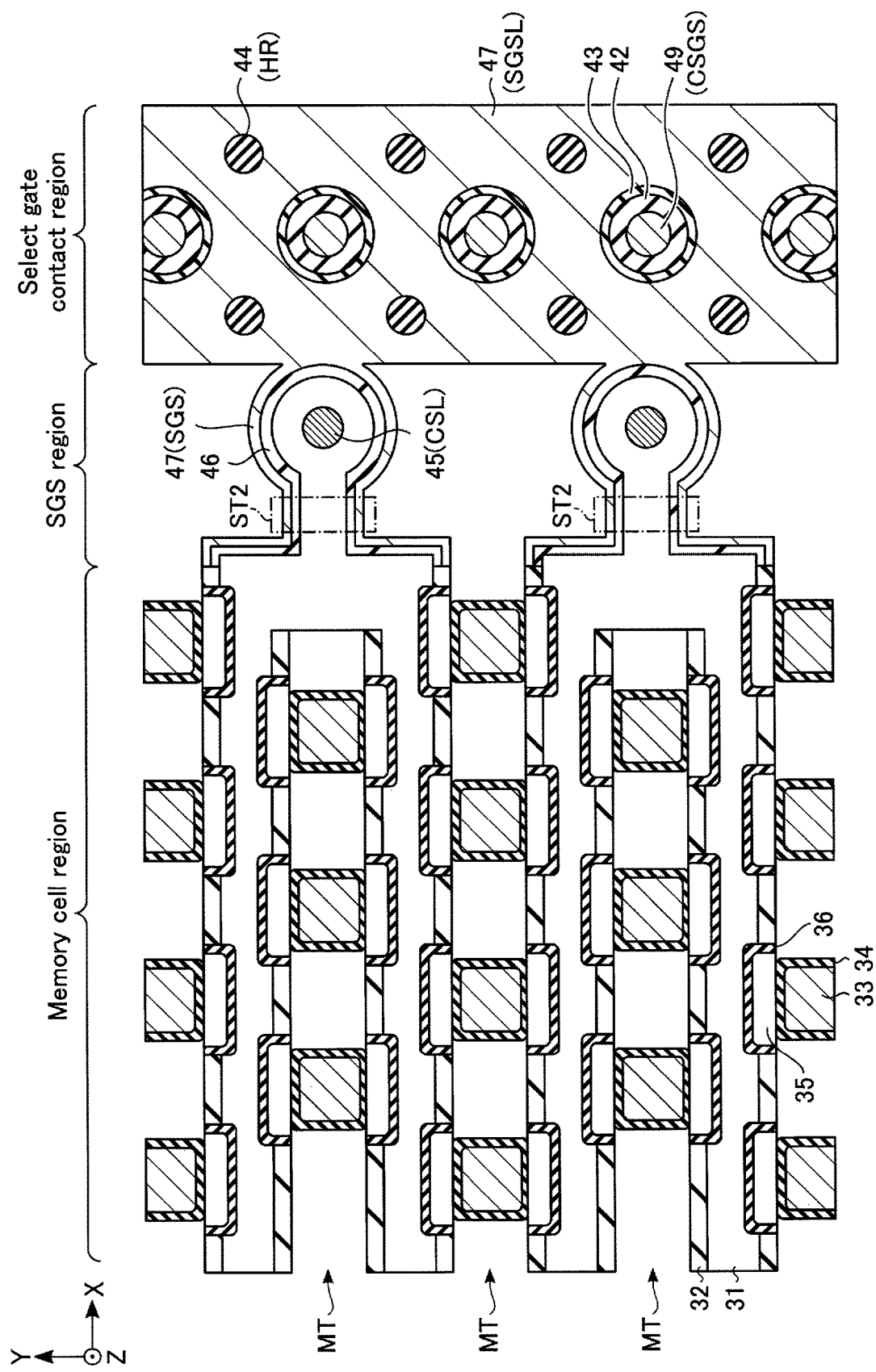
FIG. 11 is an enlarged view of a region RB shown in FIG. 6.

1.1.4.6. Details of Memory Cell Region, SGS Region and Select Gate Contact Region The plane configuration of the memory cell array 18 in the memory cell region, the SGS region, and the select gate contact region corresponding to the select gate lines SGSL will be described in detail with reference to FIG. 11. FIG. 11 is an enlarged view of the region RB shown in FIG. 6. In the example of FIG. 11, the insulating layers are partly omitted, and the dummy memory cell transistors DMC are omitted in order to simplify the description.

As shown in FIG. 11, two semiconductor layers 31 are commonly coupled in the vicinity of the SGS region, and a conductive layer 45 is formed in the SGS region so as to penetrate the semiconductor layers 31. The conductive layer 45 functions as a contact plug CSL. In the example of FIG. 11, the semiconductor layer 31 is in the shape of a circle at the coupling area between the semiconductor layer 31 and the conductive layer 45, as in the example of FIG. 10. The conductive layer 45 may be formed of the same conductive material as that of the conductive layer 37 (contact plug CBL).

In the SGS region, an insulating layer 46 is formed so as to surround the sides of the semiconductor layer 31, as in the insulating layer 38. The insulating layer 46 functions as a gate insulating film of the select transistor ST2. The insulating layer 46 may be formed of the same insulating material as that of the insulating layer 38.

One side of the insulating layer 46, which is opposed to the other side that is in contact with the semiconductor layer 31, is in contact with a conductive layer 47. The conductive layer 47 functions as a select gate line SGSL. More specifically, the conductive layer 47 includes a first portion extending in the Y direction and a plurality of second portions one side of each of which is in contact with the insulating layer 46 and one end of each of which is in contact with the first portion of the conductive layer 47 in the SGS region. Note that the conductive layer 47 may be formed of the same conductive material as that of the conductive layer 39 (select gate line SGDL).

In the SGS region, a region including the semiconductor layer 31 from the memory cell region to the conductive layer 45, the insulating layer 46 and the second portion of the conductive layer 47 functions as a select transistor ST2. More specifically, the second portion of the conductive layer 47 functions as a gate electrode of the select transistor ST2, the insulating layer 46 functions as a gate insulating film of the select transistor ST2, and a channel of the select transistor ST1 is formed in the semiconductor layer 31.

In the select gate contact region, a conductive layer 49 and an insulating layer 44 are formed to penetrate the first portion of the conductive layers 47. The conductive layer 49 functions as a contact plug CSGD. The conductive layer 49 is electrically coupled to any one of the first portions of the conductive layers 47 stacked in the Z direction. Like in the select gate contact region corresponding to the select gate lines SGDL, the insulating layers 42 and 43 are formed to surround the conductive layer 49. Note that the conductive layer 49 may be formed of the same conductive material as that of the conductive layer 40 (contact plug CSGD).

1.1.5. Sectional Configuration of Memory Cell Array

Next is a description of an example of the sectional configuration of the memory cell array 18.

1.1.5.1. Sectional Configuration of Memory Cell Region

Figure 12:
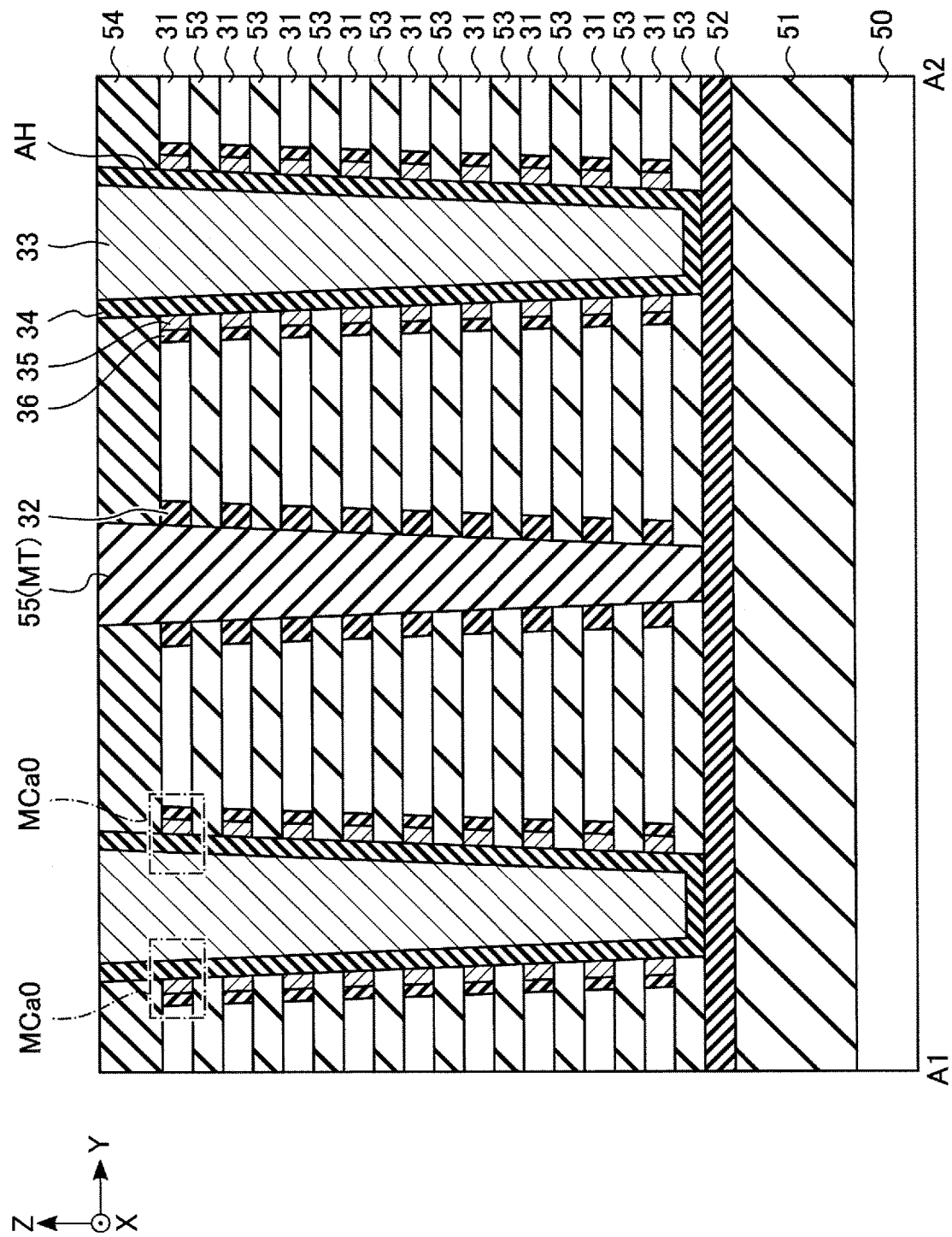
FIG. 12 is a sectional view taken along line A1-A2 shown in FIG. 10.

First, the sectional configuration of the memory cell region will be described with reference to FIG. 12. FIG. 12 is a sectional view taken along line A1-A2 in FIG. 10.

As shown in FIG. 12, an insulating layer 51 is formed on a semiconductor substrate 50. For example, silicon oxide ($SiO_2$) is used for the insulating layer 51. The insulating layer 51 includes a plurality of interconnect layers and a transistor (not shown in FIG. 12) formed on the semiconductor substrate 50. The memory cell array 18 is provided on the insulating layer 51.

More specifically, an insulating layer 52 is formed on an insulating layer 51. The insulating layer 52 functions as an etching stopper in processing holes for various contact plugs, memory trenches MT, etc. The insulating layer 52 may be of any insulating material that provides a sufficiently high etching selectivity to an insulating layer 53 formed thereon. The insulating material is selected from a metal nitride (for example, silicon nitride (SiN)) or a metal oxide (for example, aluminum oxide (AlO)). The insulating material may be a mixture film or a laminated film of these materials.

The insulating film 53 is formed on the insulating film 52. For example, $SiO_2$ is used for the insulating film 53. For example, nine semiconductor layers 31 are stacked on the insulating film 53 with an insulating film 53 between adjacent two semiconductor layers 31. In other words, for example, nine insulating layers 53 and nine semiconductor layers 31 are stacked alternately. Note that the number of semiconductor layers 31 stacked is optional. For example, polysilicon is used for the semiconductor layers 31.

An insulating film 54 is formed on the topmost semiconductor layer 31. For example, $SiO_2$ is used for the insulating film 54.

A hole AH is formed to penetrate the insulating layer 54 and the alternately-stacked nine semiconductor layers 31, and reach the insulating layer 52 at its bottom. In the hole AH, the word line pillars WLP are formed. The insulating layer 34 is formed on the side and bottom of the hole AH, and the conductive layer 33 is embedded in the hole AH. The charge storage layer 35 that is in contact with the side of the insulating layer 34 and the insulating layer 36 provided between the charge storage layer 35 and the semiconductor layer 31 are formed between the insulating layer 34 and the semiconductor layer 31.

The conductive layer 33 is formed of a conductive material. For example, a metal material or a semiconductor material doped with impurities is be used as the conductive material.

The insulating layer 34 is formed of an insulating material. For example, the insulating material may be selected from a high dielectric constant film, such as oxide or nitride of aluminum (Al), titanium (Ti), zirconium (Zr), or lanthanum (La), a high breakdown voltage film, such as $SiO_2$ or silicon oxynitride (SiON), or a mixture film or a laminated film of these materials.

For example, polysilicon is used as the charge storage layer 35. The charge storage layer 35 may be selected from a metal nitride, such as SiN, tantalum nitride (TaN), or titanium nitride (TiN), a metal silicon compound included tungsten (W) or ruthenium (Ru), or a mixture film or a laminated film of silicon that contains metal particle or insulating film.

The insulating layer 36 may be selected from, for example, $SiO_2$, SiN, SiON, or a mixture film or a laminated film of these materials.

In addition, a memory trench MT is formed in the insulating layers 36 to penetrate the insulating layer 54 and the alternately-stacked nine semiconductor layers 31 and nine insulating layers 53, and reach the insulating layer 52 at its bottom. An insulating layer 55 is embedded in the memory trench MT. For example, $SiO_2$ is used for the insulating layer 55.

Between the insulating layer 55 and the semiconductor layers 31, the insulating layers 32 are formed. For example, $SiO_2$ is used for the insulating layers 32.

1.1.5.2. Sectional Configuration of SGD Region

Figure 13:
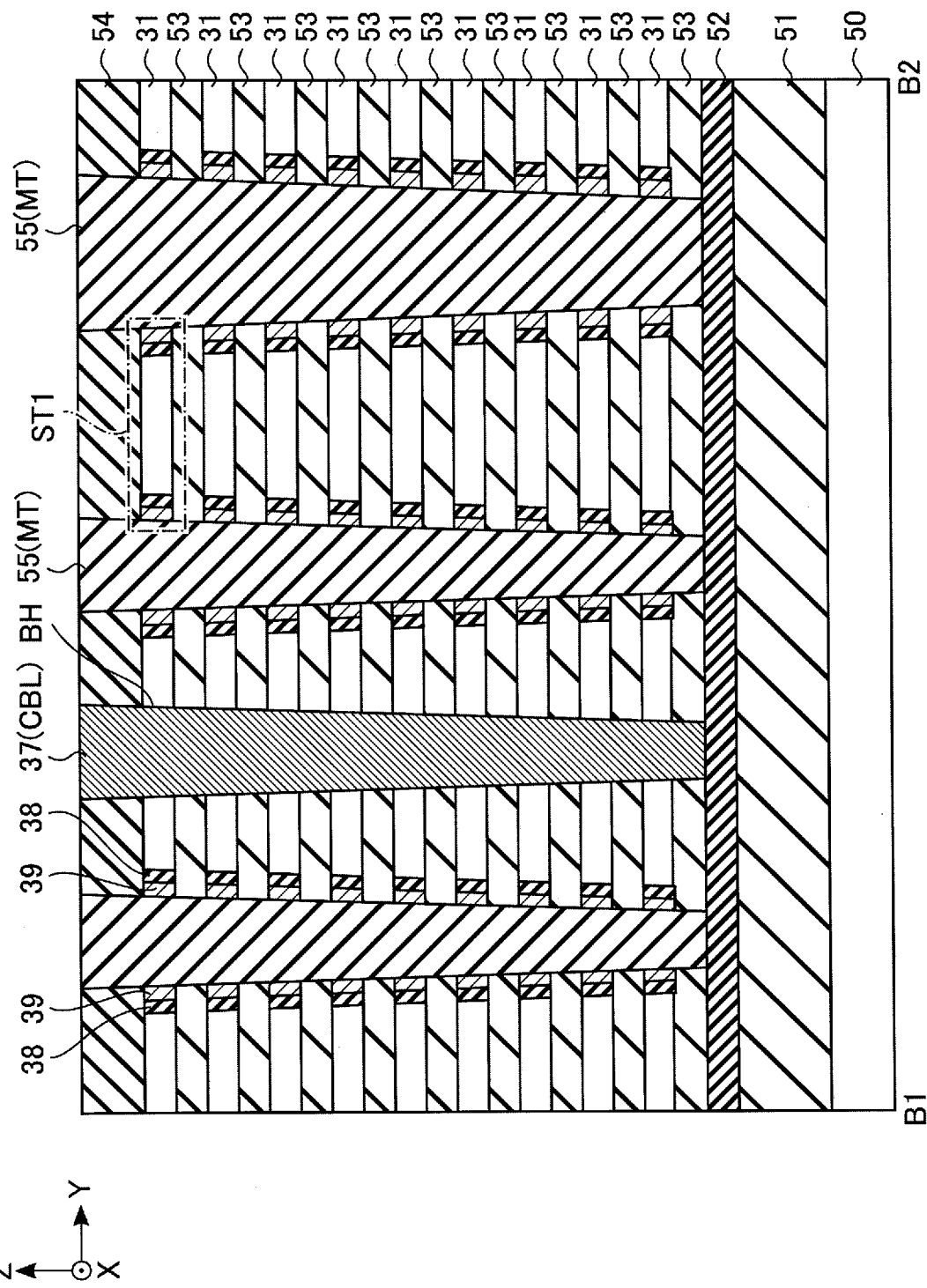
FIG. 13 is a sectional view taken along line B1-B2 shown in FIG. 10.

The sectional configuration of the SGD region will be described below with reference to FIG. 13. FIG. 13 is a sectional view taken along line B1-B2 in FIG. 10.

As shown in FIG. 13, nine insulating layers 53 and nine semiconductor layers 31, for example, are alternately stacked on an insulating layer 52, and an insulating layer 54 is formed on the uppermost semiconductor layer 31, as in FIG. 12.

A hole BH is formed so as to penetrate the insulating layer 54, and the alternately-stacked nine semiconductor layers 31 and nine insulating layers 53, and reach the insulating layer 52 at its bottom. A contact plug CBL is formed in the hole BH. A conductive layer 37 is embedded in the hole BH. The conductive layer 37 is formed of a conductive material which may be, for example, a metal material or a semiconductor material doped with impurities.

In the SGD region, a conductive layer 39 which is in contact with the side of the insulating layer 55, and an insulating layer 38 provided between the conductive layer 39 and each semiconductor layer 31, are formed between the insulating layer 55 and the semiconductor layer 31. The conductive layer 39 is formed of a conductive material which may be, for example, a metal material or a semiconductor material such as Si doped with impurities. For example, $SiO_2$ is used as the insulating layer 38.

1.1.5.3. Sectional Configuration of Select Gate Contact Region

Figure 14:
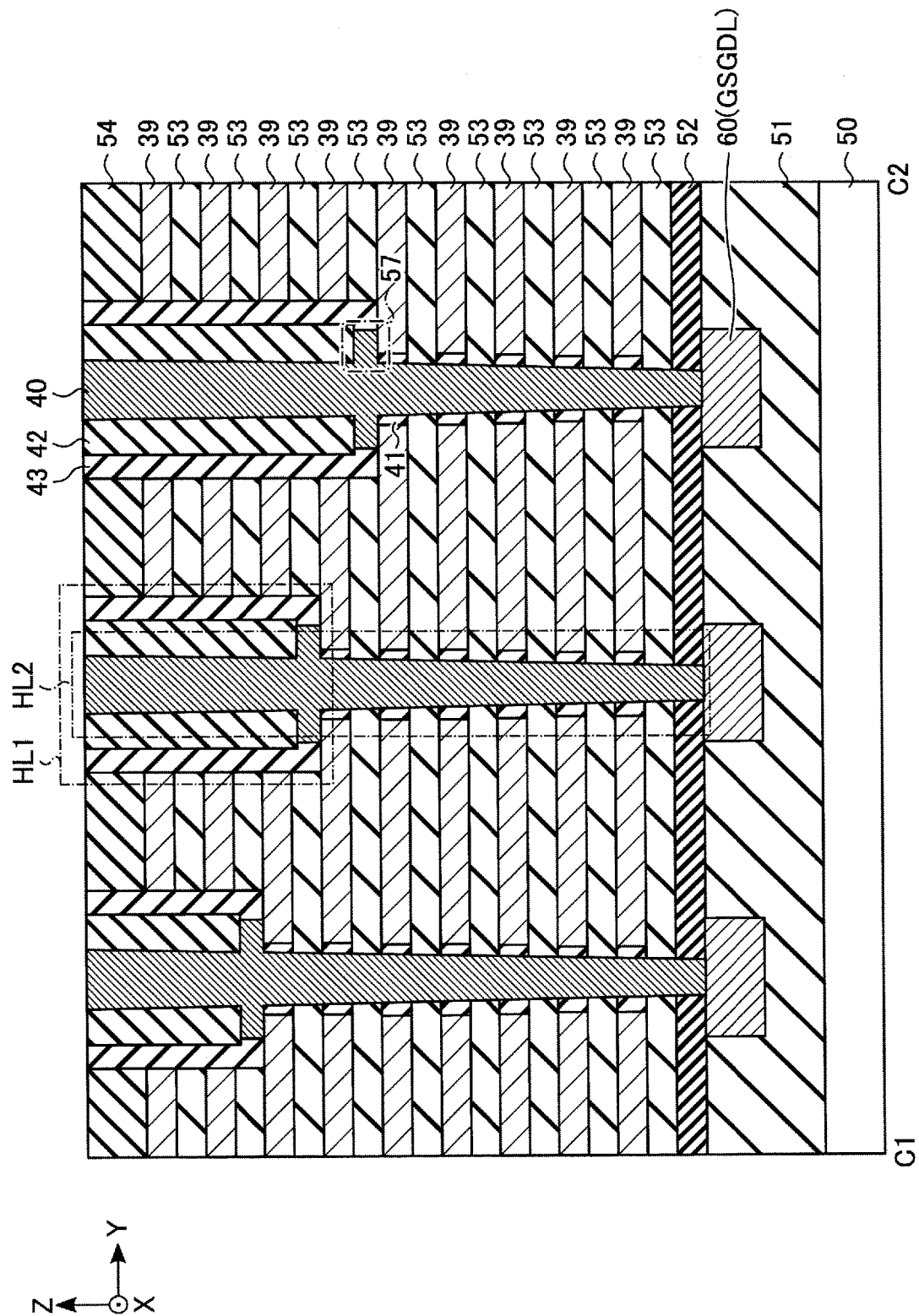
FIG. 14 is a sectional view taken along line C1-C2 shown in FIG. 10.

The sectional configuration of the select gate contact region corresponding to the select gate line SGDL will be described below with reference to FIG. 14. FIG. 14 is a sectional view taken along line C1-C2 in FIG. 10.

As shown in FIG. 14, a plurality of conductive layers 60 are formed to extend in the X direction in the vicinity of the top surface of the insulating layer 51. The conductive layers 60 function as global select gate lines GSGDL. The conductive layers 60 are each formed of metal material, a semiconductor to which impurities are doped, or the like.

On the insulating layer 52, for example, nine insulating layers 53 and nine conductive layers 39 are stacked alternately. The conductive layers 39 and the semiconductor layers 31 are formed on the same layer. The insulating layer 54 is formed on the uppermost conductive layer 39.

A plurality of holes HL1 are formed to penetrate the insulating layer 54 and reach any of the stacked conductive layers 39. At least one of the holes HL1 is formed on each of the conductive layers 39. The number of holes HL1 is thus not less than the number of conductive layers 39. The example of FIG. 14 shows a hole HL1 whose bottom reaches the third conductive layer 39 from the top layer, a hole HL1 whose bottom reaches the fourth conductive layer 39 from the top layer, and a hole HL1 whose bottom reaches the fifth conductive layer 39 from the top layer.

An insulating layer 43 is formed on part of the side and bottom of each of the holes HL1. For example, SiN is used as the insulating layer 43. In each of the holes HL1, the insulating layer 42 is formed in such a manner that its side is in contact with the insulating layer 43. For example, $SiO_2$ is used as the insulating layer 42.

A hole HL2 is formed so as to penetrate each of the holes HL1 and reach the corresponding conductive layer 60 at its bottom. An insulating layer 41 is formed on part of the side of the hole HL2, and the conductive layer 40 is embedded in the hole HL2.

In the vicinity of the bottom of each of the holes HL1, a part of the insulating layer 43 is removed, and a coupling portion 57 is formed at the conductive layer 40 to protrude from its side. The bottom of the coupling portion 57 is coupled to the conductive layer 39. That is, the conductive layer 40 (contact plug CSGD) is electrically coupled, at its bottom, to the corresponding conductive layer 60 (global select gate line GSGDL), and also electrically coupled to one of the conductive layers 39 (select gate line SGDL) via the coupling portion 57 protruding therefrom.

For example, the level of the top surface of the coupling portion 57 is lower than that of the bottom of the conductive layer 39 provided thereabove.

1.2. Layout of Semiconductor Layers in SGD Region

Figure 15:
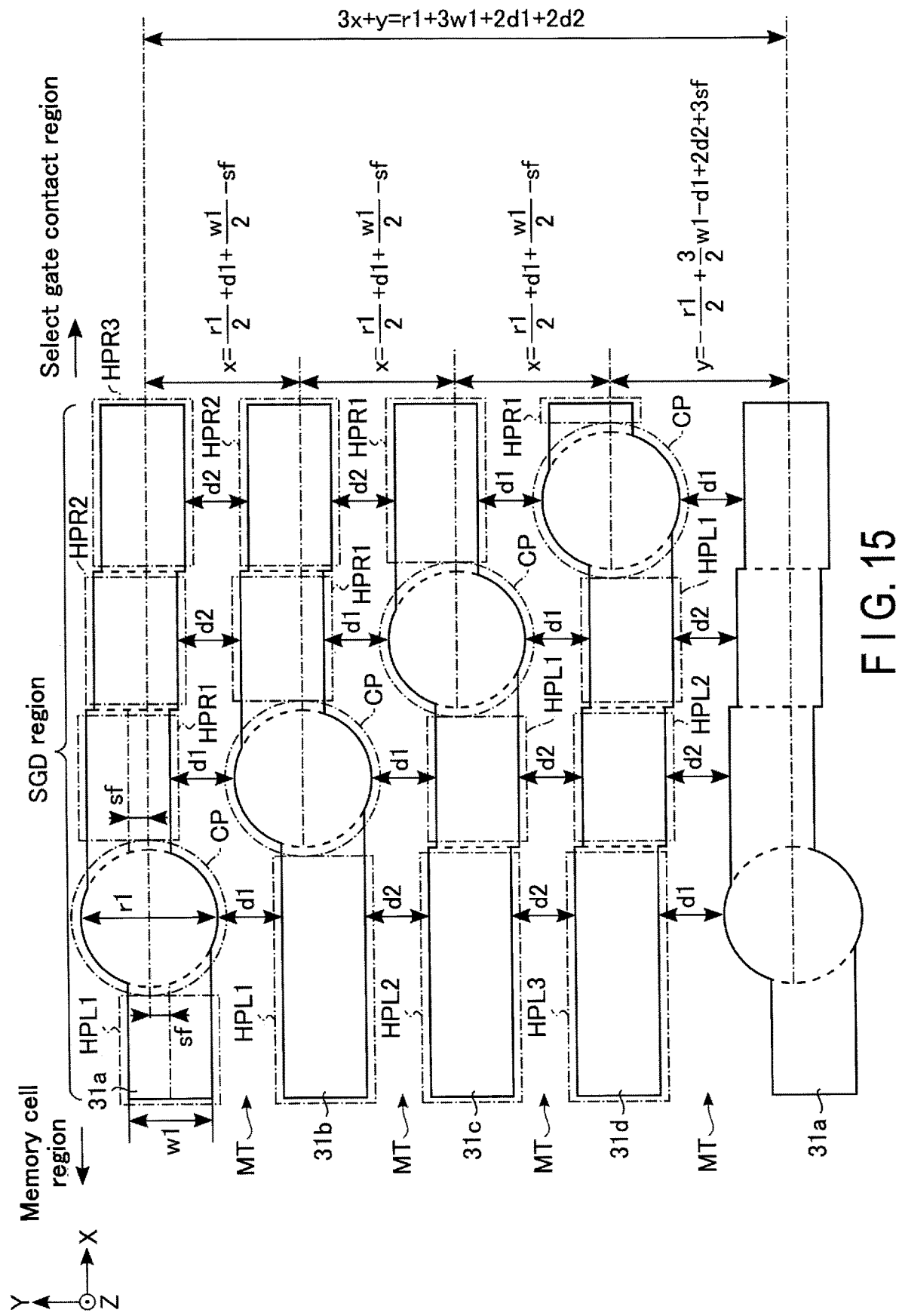
FIG. 15 is a diagram showing an example of a layout of the semiconductor layer in the memory cell array included in the semiconductor memory device according to the first embodiment.
Figure 16:
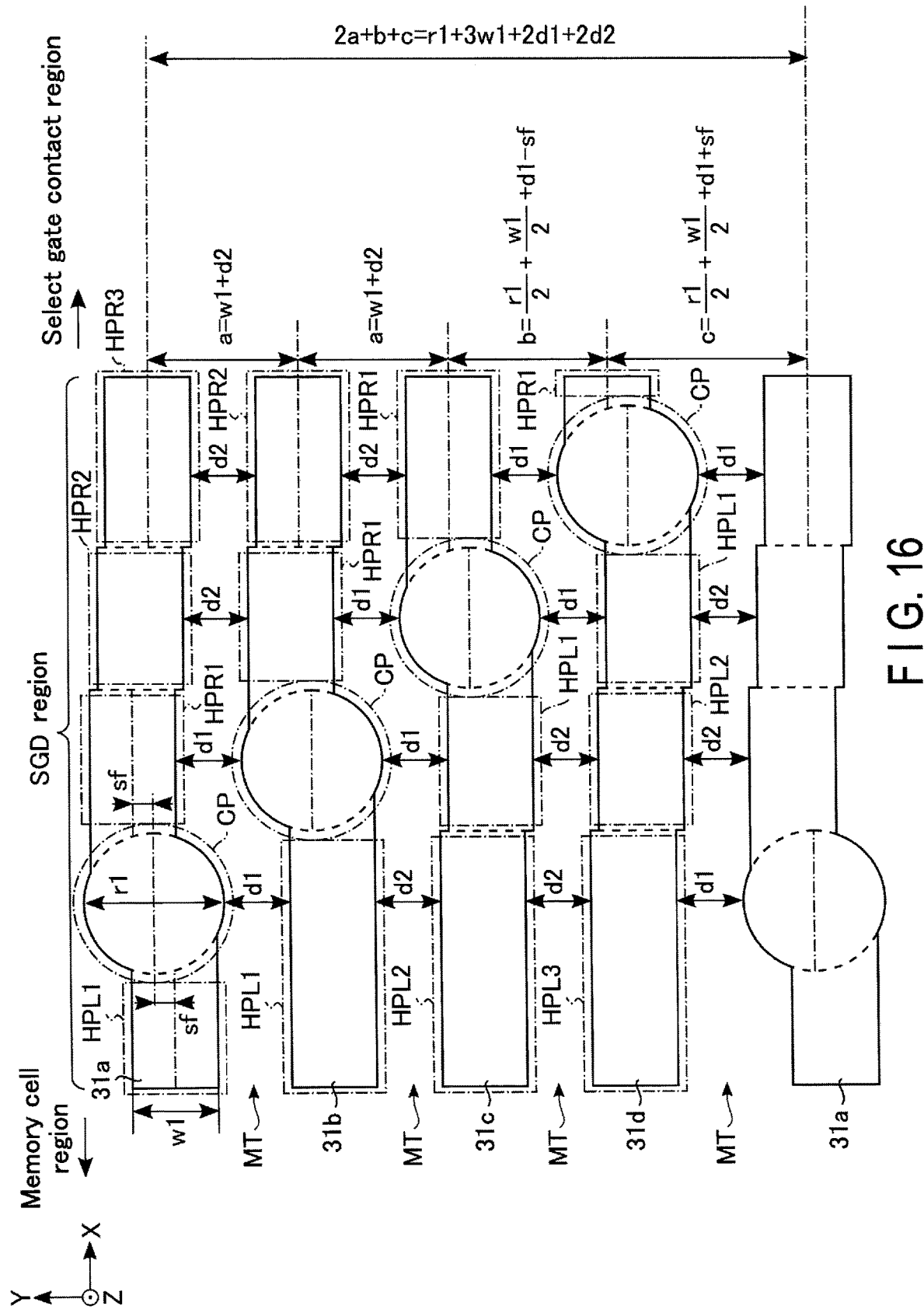
FIG. 16 is a diagram showing another example of the layout of the semiconductor layer in the memory cell array included in the semiconductor memory device according to the first embodiment.

An example of the layout of the semiconductor layers 31 in the SGD region will be described below with reference to FIGS. 15 and 16. FIGS. 15 and 16 show an example of a case where the semiconductor layers 31 in the SGD region are arranged closest to each other in the Y direction. In order to simplify the description, the conductive layer 37 (contact plug CBL), insulating layer 38 and conductive Layer 39 (select gate SGD) are omitted.

As shown in FIG. 15, four semiconductor layers 31 each including a circular coupling area corresponding to the four-line staggered contact plugs CBL (not shown) will be defined as semiconductor layers 31a to 31d in the order that the coupling area is closer to the memory cell area. Each of the semiconductor layers 31a to 31d includes a coupling portion CP corresponding to the coupling area and a plurality of leading portions HP arranged in the X direction with their positions varying in the Y direction. In other words, the semiconductor layers 31a to 31d are arranged to repeat a four-line pattern in which the four adjacent coupling portions CP in the Y direction are arranged with their positions varying in the X direction. Hereinafter, the leading portions arranged in order from the coupling portions CP toward the memory cell region will be referred to as leading portions HPL1 to HPL3, and the leading portions arranged in order from the coupling portions CP toward the select gate contact region will be referred to as HPR1 to HPR3. If the leading portions are limited to none of the leading portions HPL1 to HPL3 and HPR1 to HPR3, they will be referred to as leading portions HP. Note that the shape of the coupling portions CP is not limited to a circle, and the shape of the leading portions HP in not limited to a rectangle.

Hereinafter, the width of each leading portion HP in the Y direction will be defined as "w1", and the diameter of each coupling portion CP will be defined as "r1". In the following description, in the semiconductor layers 31a to 31d, the widths of the leading portions HP are the same in the Y direction and the diameters of the coupling portions CP are the same; however, the portions may differ in size.

The leading portions HPL1 and HPR1 are in contact with each other at one end in the X direction such that they are symmetrical with regard to the center of the coupling portion CP. The amount of shift from the center of the coupling portion CP to the center of each of the leading portions HPL1 and HPR1 in the Y direction will be defined as "sf". The relationship among shift amount sf, width w1 and diameter r1 is as follows: $0 < sf < ((r1)-(w1))/2$. In the two adjacent semiconductor layers 31 in the Y direction, the distance from the coupling portion CP to the leading portion HP in the Y direction will be defined as "d1", and the Y-direction minimum distance between two leading portions HP, which are adjacent to each other in the Y direction, will be defined as "d2". For example, the distances d1 and d2 are the minimum dimensions determined in consideration of superposition accuracy of photolithography and the process margins such as processing in the manufacturing process. It is preferable that the distances d1 and d2 be almost the same. Since the semiconductor layers 31 are so arranged that the distances d1 and d2 are the same, they are arranged at the smallest pitches in the Y direction. Note that the distance d1 may be longer than the distance d2.

The semiconductor layers 31a to 31d will specifically be described below.

The semiconductor layer 31a includes a coupling portion CP and leading portions HPL1 and HPR1 to HPR3. The leading portion HPL1 is provided from the coupling portion CP toward the memory cell region. The leading portion HPL1 is located in a position shifted by only shift amount sf in a direction approaching the semiconductor layer 31b from the center of the coupling portion CP in the Y direction.

The leading portions HPR1 to HPR3 are provided adjacent to each other in the X direction with their positions varying in the Y direction from the coupling portion CP toward the select gate contact region. That is, the leading portions HPR1 to HPR3 are arranged stepwise along the X direction. The leading portion HPR1 is located in a position shifted by only shift amount sf in a direction away from the semiconductor layer 31b from the center of the coupling portion CP, in the Y direction. The leading portion HPR2 is located in a position shifted in a direction approaching the semiconductor layer 31b from the position of the leading portion HPR1 in the Y direction. The leading portion HPR3 is located in a position shifted in a direction approaching the semiconductor layer 31b from the position of the leading portion HPR2 in the Y direction.

The semiconductor layer 31b includes a coupling portion CP and leading portions HPL1, HPR1 and HPR2. The relationship in position between the coupling portion CP and the leading portions HPL1, HPR1 and HPR2 is the same as that in the semiconductor layer 31a.

The semiconductor layer 31c includes a coupling portion CP and leading portions HPL1, HPL2 and HPR1. The relationship in position between the coupling portion CP and the leading portions HPL1 and HPR1 is the same as that in the semiconductor layers 31a and 31b.

The leading portions HPL1 and HPL2 are provided adjacent to each other in the X direction with their positions varying in the Y direction from the coupling portion CP toward the memory cell region. That is, the leading portions HPL1 and HPL2 are arranged stepwise along the X direction. The leading portion HPL2 is located in a position shifted in a direction approaching the semiconductor layer 31b from the position of the leading portion HPL1 in the Y direction.

The semiconductor layer 31d includes a coupling portion CP and leading portions HPL1 to HPL3 and HPR1. The relationship in position between the coupling portion CP and the leading portions HPL1, HPL2 and HPR1 is the same as that in the semiconductor layer 31c.

The leading portions HPL1 to HPL3 are provided adjacent to each other in the X direction with their positions varying in the Y direction from the coupling portion CP toward the memory cell region. That is, the leading portions HPL1 to HPL3 are arranged stepwise along the X direction. The leading portion HPL3 is located in a position shifted in a direction approaching the semiconductor layer 31c from the position of the leading portion HPL2 in the Y direction.

The distance between the coupling portion CP of the semiconductor layer 31a and each of the leading portion HPL1 of the semiconductor layer 31b and the leading portion HPL3 of the semiconductor layer 31d, the distance between the coupling portion CP of the semiconductor layer 31b and each of the leading portion HPR1 of the semiconductor layer 31a and the leading portion HPL1 of the semiconductor layer 31c, the distance between the coupling portion CP of the semiconductor layer 31c and each of the leading portion HPR1 of the semiconductor layer 31b and the leading portion HPL1 of the semiconductor layer 31d, and the distance between the coupling portion CP of the semiconductor layer 31d and each of the leading portion HPR1 of the semiconductor layer 31c and the leading portion HPR3 of the semiconductor layer 31a are each set as d1.

Furthermore, the distance between the leading portion HPR2 of the semiconductor layer 31a and the leading portion HPR1 of the semiconductor layer 31b, the distance between the leading portion HPR3 of the semiconductor layer 31a and the leading portion HPR2 of the semiconductor layer 31b, the distance between the leading portion HPR2 of the semiconductor layer 31b and the leading portion HPR1 of the semiconductor layer 31c, the distance between the leading portion HPL1 of the semiconductor layer 31b and the leading portion HPR2 of the semiconductor layer 31c, the distance between the leading portion HPL1 of the semiconductor layer 31c and the leading portion HPR2 of the semiconductor layer 31d, the distance between the leading portion HPL2 of the semiconductor layer 31c and the leading portion HPR3 of the semiconductor layer 31d, the distance between the leading portion HPL1 of the semiconductor layer 31d and the leading portion HPR2 of the semiconductor layer 31a, and the distance between the leading portion HPL2 of the semiconductor layer 31d and the leading portion HPR1 of the semiconductor layer 31a are each set as d2.

In the Y direction, the distance between the center of the coupling portion CP of the semiconductor layer 31a and the center of the coupling portion CP of the semiconductor layer 31b, the distance between the center of the coupling portion CP of the semiconductor layer 31b and the center of the coupling portion CP of the semiconductor layer 31c, and the distance between the center of the coupling portion CP of the semiconductor layer 31c and the center of the coupling portion CP of the semiconductor layer 31d are each defined as "x". The distance x is given by the following equation.

$$x = (r1)/2 + (d1) + (w1)/2 - (sf)$$

Furthermore, in the Y direction, the distance between the center of the coupling portion CP of the semiconductor layer 31d and the center of the coupling portion CP of the semiconductor layer 31a is defined as "y". The distance y is given by the following equation.

$$y = -(r1)/2 + 3(w1)/2 - (d1) + 2(d2) + 3(sf)$$

The distance of one cycle of the four-line staggered arrangement in the Y direction, i.e., the distance from the center of the coupling portion CP of one semiconductor layer 31a to the center of the coupling portion CP of another semiconductor layer 31a adjacent to the one semiconductor layer 31a in the Y direction is given by the following equation.

$$3x+y=(r1)+3(w1)+2(d1)+2(d2)$$

Therefore, the distance (3x+y) of one cycle of the four-line staggered arrangement in the Y direction does not depend upon the shift amount sf. In contrast, the each spacing (distance x and y) of the coupling portion CP in the Y direction, i.e., the each distance between contact plugs CBL depends upon the shift amount sf and has sparse or dense.

Next is a description of a case where the distance of one cycle of the four-line staggered arrangement is obtained from the distance between the leading portions HP of adjacent two semiconductor layers 31.

As shown in FIG. 16, in the Y direction, the distance between the center of the leading portion HPR3 of the semiconductor layer 31a and the center of the leading portion HPR2 of the semiconductor layer 31b and the distance between the center of the leading portion HPR2 of the semiconductor layer 31b and the center of the leading portion HPR1 of the semiconductor layer 31c are the same and each defined as "a". In the Y direction, the distance between the center of the leading portion HPR1 of the semiconductor layer 31c and the center of the leading portion HPR1 of the semiconductor layer 31d is defined as "b". Furthermore, in the Y direction, the distance between the center of the leading portion HPR1 of the semiconductor layer 31d and the center of the leading portion HPR3 of the semiconductor layer 31a is defined as "c". Then, the distances a, b and c are given by the following equations.

$$a=(w1)+(d2)$$

$$b=(r1)/2+(w1)/2+(d1)-(sf)$$

$$c=(r1)/2+(w1)/2+(d1)+(sf)$$

The distance of one cycle of the four-line staggered arrangement in the Y direction, i.e., the distance from the center of the leading portion HPR3 of one semiconductor layer 31a to the center of the leading portion HPR3 of another semiconductor layer 31a adjacent to the one semiconductor layer 31a in the Y direction is given by the following equation.

$$2a+b+c=(r1)+3(w1)+2(d1)+2(d2)$$

That is, it is given by the following equation.

$$2a+b+c=3x+y$$

1.3. Advantages of First Embodiment

The configuration according to the first embodiment makes it possible to provide a semiconductor memory device capable of suppressing an increase in chip area.

More specifically, in the SGD region, the coupling portions CP of the semiconductor layers 31 can be staggered. Furthermore, the leading portions HP of the semiconductor layers 31 (and the insulating layers 38 and conductive layers 39b) can be arranged stepwise in the X direction. Thus, for example, in adjacent two semiconductor layers 31a and 31b, the distance d1 between the coupling portion CP of the semiconductor layer 31a and the leading portion HPL1 of the semiconductor layer 31b and the distance d2 between the leading portion HP of the semiconductor layer 31a and the leading portion HP of the semiconductor layer 31b can be set substantially the same. Thus, in the Y direction, the semiconductor layers 31 can be arranged the closest to each other. It is therefore possible to suppress an increase in chip area.

2. Second Embodiment

Next is a description of the second embodiment. In the second embodiment, the layout of contact plugs CSGD (conductive layers 40), select gate lines SGDL (conductive layers 39a) and dummy pillars HR (insulating layers 44) in the select gate contact region will be described, taking three examples. The points different from the first embodiment will mainly be described below.

2.1. First Example

First, the first example will be described with reference to FIG. 17. To simplify the description, in the example of FIG. 17, the semiconductor layers 31 extend in the X direction (i.e., they are not arranged stepwise) in the SGD region.

Figure 17:
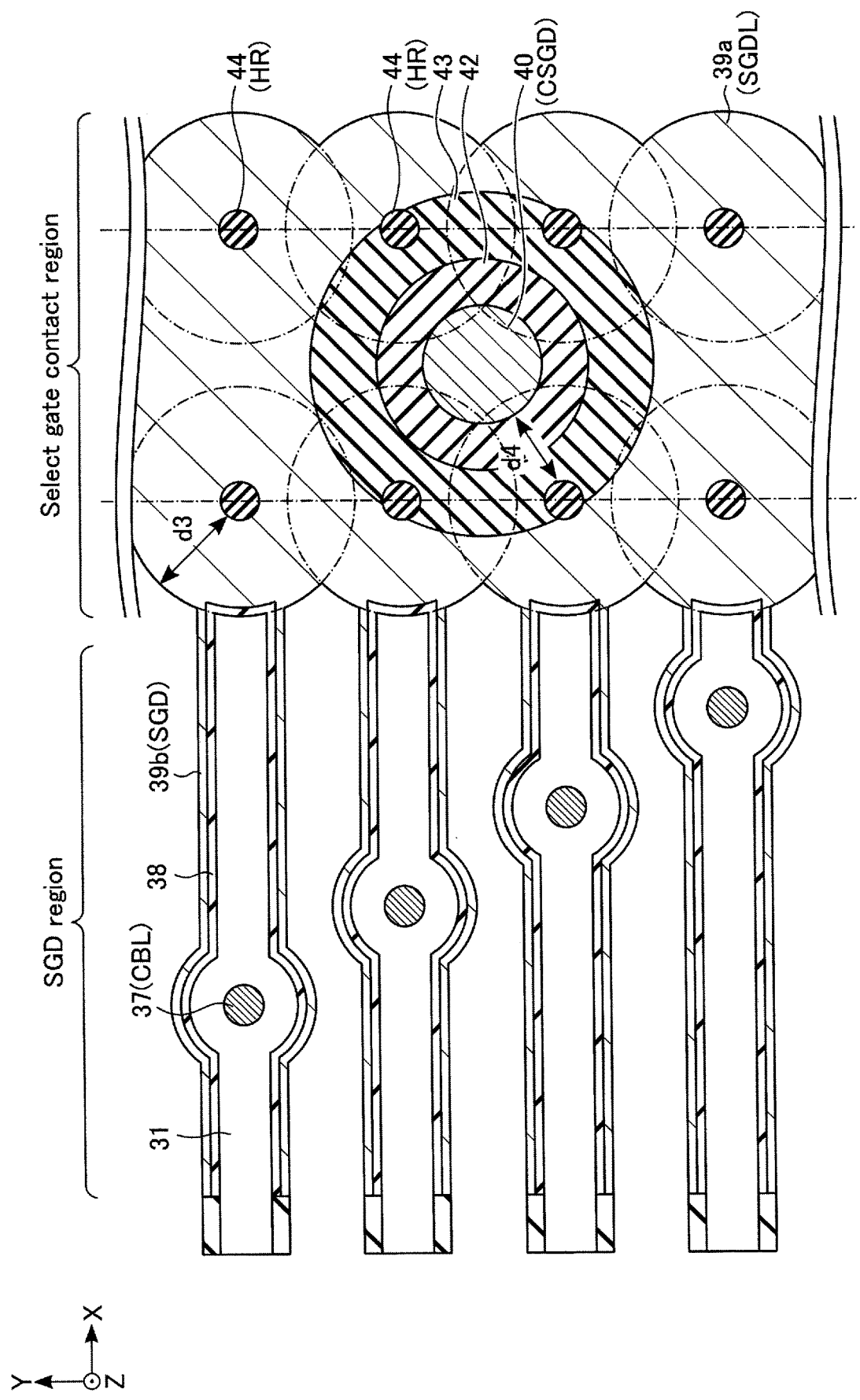
FIG. 17 is a top view of a select gate contact region in a memory cell array included in a semiconductor memory device according to a first example of a second embodiment.

As shown in FIG. 17, for example, a plurality of insulating layers 44 (dummy pillars HR) are arranged in two lines in the Y direction in the select gate contact region. Then, one semiconductor layer 31 and two insulating layers 44 are arranged along the X direction (to be located in the same position in the Y direction). Note that the one semiconductor layer 31 and the two insulating layers 44 may be located in different positions in the Y direction In the select gate contact region, the surface of conductive layer 39a, which faces toward the X direction, has a shape such as an overlapping shape of concentric circles around the corresponding insulating layers 44 arranged in the Y direction. That is, the surface of conductive layer 39a, which faces toward the X direction, has a curved portion. When the minimum distance from the side of the insulating layer 44 to that of the conductive layer 39a is defined as "d3", the insulating layer 44 is formed distance d3 inward from the side of the conductive layer 39a. For example, distance d3 is the minimum dimension determined in consideration of the process margin when the conductive layer 39a is formed in the manufacturing process. The distance between adjacent two insulating layers 44 in the Y direction is less than 2×(d3). That is, in the conductive layer 39a, distance d3 is set such that the concentric circles around the insulating layers 44 cross each other in the Y direction.

For example, one contact plug CSGD (conductive layer 40) is provided for each of the four semiconductor layers 31 that are arranged adjacent to each other in the Y-direction. The insulating layers 42 and 43 are provided in order on the side of the conductive layer 40. The conductive layer 40 is interposed between two lines of the insulating layers 44 arranged in the X direction. The conductive layer 40 is so formed that the distance from the side of the conductive layer 40 to that of the insulating layer 44 is distance d4 or longer. For example, distance d4 is the minimum dimension determined in consideration of the process margin when the conductive layer 40 is formed in the manufacturing process. Distance d4 is shorter than distance d3. As shown in FIG. 17, the insulating layer 44 may be formed to penetrate the insulating layer 43 if the distance between the insulating layer 44 and the conductive layer 40 is distance d4 or longer.

2.2. Second Example

The second example will be described with reference to FIG. 18. To simplify the description, in the example of FIG.

18, the semiconductor layers 31 extend in the X direction in the SGD region. The points different from the first example will mainly be described below.

As shown in FIG. 18, in the second example, eight dummy pillars HR (insulating layers 44) are arranged the same distance away from the insulating layer 43 (i.e., the conductive layer 40).

More specifically, for example, eight insulating layers 44 and one contact plug CSGD (conductive layer 40) are provided for every four semiconductor layers 31 which are arranged adjacent to each other in the Y direction. The insulating layers 42 and 43 are provided in order on the side of the conductive layer 40.

One semiconductor layer 31 and two insulating layers 44 are arranged along the X direction. If the distance from the side of each of the insulating layers 44 to the side of the insulating layer 43 is defined as "d5", the eight insulating layers 44 are arranged in a position distance d5 away from the insulating layer 43. That is, the eight insulating layers 44 are arranged in a position the same distance away from the conductive layer 40. For example, distance D5 is the minimum dimension determined in consideration of the process margin when the insulating layer 44 is formed in the manufacturing process.

In the select gate contact region, the surface of each conductive layer 39a, which faces toward the X direction, has a shape such as an overlapping shape of concentric circles around the corresponding insulating layer 44 that are overlapped. Each of the insulating layers 44 is formed distance d3 inward from the side of the corresponding conductive layer 39a.

In the example of FIG. 18, two of the four semiconductor layers 31 in which a coupling portion CP is provided in a position relatively close to the select gate contact region, and the insulating layers 44 formed in a position relatively far from the SGD region, are arranged along the X direction. Then, two of the four semiconductor layers 31 in which a coupling portion CP is provided in a position relatively far from the select gate contact region, and the insulating layers 44 formed in a position relatively close to the SGD region 44, are arranged along the X direction. Regardless of the arrangement of the coupling portions CP (conductive layers 37), therefore, a longer distance than a preset distance can be secured from the conductive layer 37 to its corresponding conductive layer 39a (a fixed distance or longer can be secured).

2.3. Third Example

The third example will be described with reference to FIG. 19. The points different from the first and second examples will mainly be described below.

Figure 19:
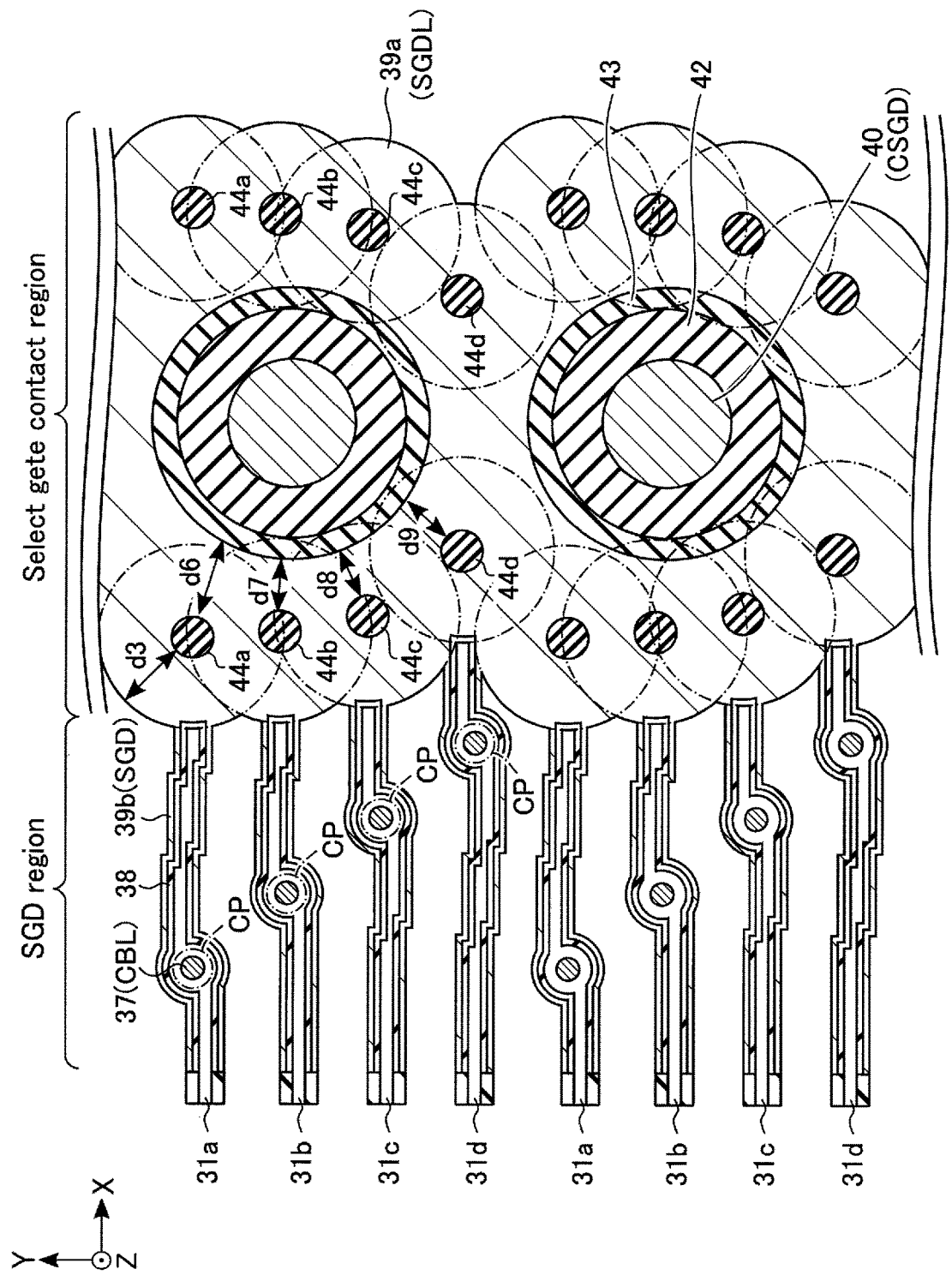
FIG. 19 is a top view of a select gate contact region in a memory cell array included in a semiconductor memory device according to a third example of the second embodiment.

As shown in FIG. 19, in the third example, eight dummy pillars HR are arranged at different distances from the contact plugs CSGD.

More specifically, four semiconductor layers 31 corresponding to the four-line staggered contact plugs CBL will be referred to as semiconductor layers 31a to 31d in the order that the coupling portions CP (contact plugs CBL) are closer to the memory cell region (in the order that they are distant from the select gate contact region). For example, eight insulating layers 44 and one contact plug CSGD (conductive layer 40) are provided for every four semiconductor layers 31a to 31d. The insulating layers 42 and 43 are formed in order on the side of the conductive layer 40.

In the select gate contact region, the surface of each conductive layer 39a, which faces toward the X direction, has a shape such as an overlapping shape of concentric circles around the corresponding insulating layers 44. Each of the insulating layers 44 is formed distance d3 inward from the side of the corresponding conductive layer 39a.

For example, the eight insulating layers 44 differ in their positions in the X direction. Hereinafter, the insulating layers 44 arranged alongside the semiconductor layer 31a in the X direction will be referred to as insulating layers 44a. Similarly, the insulating layers 44 arranged alongside the semiconductor layer 31b in the X direction will be referred to as insulating layers 44b. The insulating layers 44 arranged alongside the semiconductor layer 31c in the X direction will be referred to as insulating layers 44c. The insulating layers 44 arranged alongside the semiconductor layer 31d in the X direction will be referred to as insulating layers 44d. The distance from the side of the insulating layer 44a to that of the insulating layer 43 is defined as "d6". Similarly, the distance from the side of the insulating layer 44b to that of the insulating layer 43 is defined as "d7". The distance from the side of the insulating layer 44c to that of the insulating layer 43 is defined as "d8". The distance from the side of the insulating layer 44d to that of the insulating layer 43 is defined as "d9". For example, distances d6 to d9 are each not shorter than distance d5 described with reference to FIG. 18.

Distances d6 to d9 may be different from one another if the distance from the side of the insulating layer 44 to that of the insulating layer 43 (i.e., the conductive layer 40) is not shorter than a preset one. For example, in the example of FIG. 19, the insulating layers 44a, 44b, 44c and 44d are arranged in that order in the X direction in accordance with the arrangement of the coupling portions CP of the semiconductor layers 31a to 31d. The distances d6 to d9 are set based upon the arrangement of the insulating layers 44a to 44d. The four semiconductor layers 31a to 31d can thus secure a longer distance than a preset distance from the conductive layer 37 to conductive layer 39a, regardless of the arrangement of the coupling portions CP (conductive layers 37).

2.4. Advantages of Second Embodiment

The second embodiment can be applied to the first embodiment.

With the configuration according to the first example of the second embodiment, the insulating layers 44 can be formed through the insulating layer 43 if the distance between each of the insulating layers 44 and the conductive layer 40 is not shorter than a preset distance. It is thus possible to suppress an increase in the area of the select gate contact region in the X direction.

With the configurations according to the second and third examples of the second embodiment, the position of the insulating layers 44 in the Y direction can be set optionally if the distance between each of the insulating layers 44 and the conductive layer 40 is not shorter than a preset distance. It is thus possible to suppress an increase in the area of the SGD region in the X direction. In addition, the distance from the coupling portion CP of each semiconductor layer 31, i.e. the contact plug CBL thereof to the side of the corresponding conductive layer 39a can be set not shorter than a preset distance. It is therefore possible to suppress variations in the interconnect length of each conductive layer 39b and also suppress variations in the voltage of a select gate SGD coupled to the select transistor ST1.

3. Third Embodiment

Next is a description of the third embodiment. The third embodiment is directed to a description of the coupling between word lines WL and row decoders 19 when a plurality of memory cell arrays 18 are stacked in the Z direction. The points different from the first and second embodiments will mainly be described below.

3.1. Sectional Configuration of Memory Cell Arrays

Figure 20:
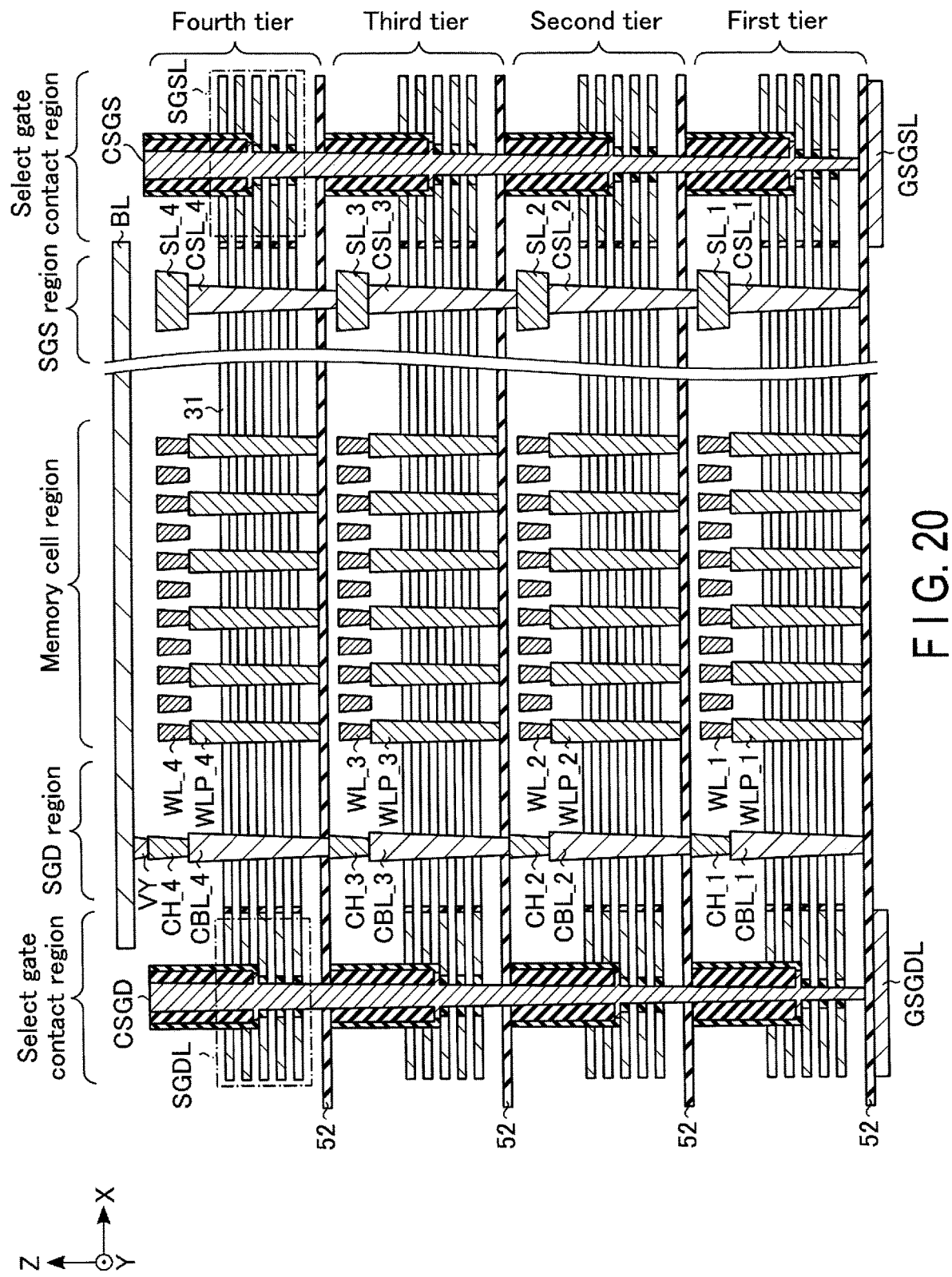
FIG. 20 is a sectional view of a memory cell array included in a semiconductor memory device according to a third embodiment.

First, the sectional configuration of a memory cell array 18 will be described with reference to FIG. 20. In the example of FIG. 20, in order to simplify the description, the insulating layers are partly omitted and so is the semiconductor substrate 50.

As shown in FIG. 20, first to fourth tiers of the memory cell array 18 are stacked above the semiconductor substrate 50 (not shown). Each of the first to fourth tiers corresponds to the configuration of the memory cell array 18 described in the first embodiment. In the following description, the contact plugs corresponding to the first tier will be referred to as CBL_1, CH_1, and CSL_1, the word line pillar WLP corresponding thereto will be referred to as WLP_1, the word line WL corresponding thereto will be referred to as WL_1, and the source line SL corresponding thereto will be referred to as SL_1. The same holds true for the second to fourth tiers.

More specifically, in the select gate contact region, global select gate lines GSGDL and GSGSL are formed below the first tier.

An insulating layer 52 is formed on the global select gate lines GSGDL and GSGSL and the first tier is formed on the insulating layer 52.

In the first tier, the word line WL_1 is formed on the word line pillar WLP_1. The contact plug CH_1 is formed on the contact plug CBL_1. The source line SL_1 is formed on the contact plug CSL_1. The contact plug CSGD is coupled to one select gate line SGDL in each of the first to fourth tiers, and its bottom is coupled to the global select gate line GSGDL. Similarly, the contact plug CSGS is coupled to one select gate line SGSL in each of the first to fourth tiers and its bottom is coupled to the global select gate line GSGSL.

An insulating layer 52 corresponding to the second tier is formed above the word line WL_1 and the second tier is formed on the insulating layer 52.

In the second tier, the word line WL_2 is formed on the word line pillar WLP_2. The contact plug CBL_2 penetrates the insulating layer 52 and is formed on the contact plug CH_1. The contact plug CH_2 is formed on the contact plug CBL_2. The contact plug CSL_2 penetrates the insulating layer 52 and is formed on the source line SL_1. The source line SL_2 is formed on the contact plug CSL_2.

An insulating layer 52 corresponding to the third tier is formed above the word line WL_2 and the third tier is formed on the insulating layer 52.

In the third tier, the word line WL_3 is formed on the word line pillar WLP_3. The contact plug CBL_3 penetrates the insulating layer 52 and is formed on the contact plug CH_2. The contact plug CH_3 is formed on the contact plug CBL_3. The contact plug CSL_3 penetrates the insulating layer 52 and is formed on the source line SL_2. The source line SL_3 is formed on the contact plug CSL_3.

An insulating layer 52 corresponding to the fourth tier is formed above the word line WL_3 and the fourth tier is formed on the insulating layer 52.

In the fourth tier, the word line WL_4 is formed on the word line pillar WLP_4. The contact plug CBL_4 penetrates the insulating layer 52 and is formed on the contact plug CH_3. The contact plug CH_4 is formed on the contact plug CBL_4. The contact plug VY is formed on the contact plug CH_4. On the contact plug VY, a bit line BL is formed to extend in the X direction. That is, the contact plugs CBL_1 to CBL_4 are coupled to one bit line BL.

The contact plug CSL_4 penetrates the insulating layer 52 and is formed on the source line SL_3. On the contact plug CSL_4, the source line SL_4 is formed. That is, the source lines SL_1 to SL_4 are coupled in common.

3.2. Configuration of Word Lines and Row Decoders 3.2.1. Overall Configuration of Word Lines and Row Decoders The overall configuration of word lines WL and row decoders 19 will be described with reference to FIG. 21.

Figure 21:
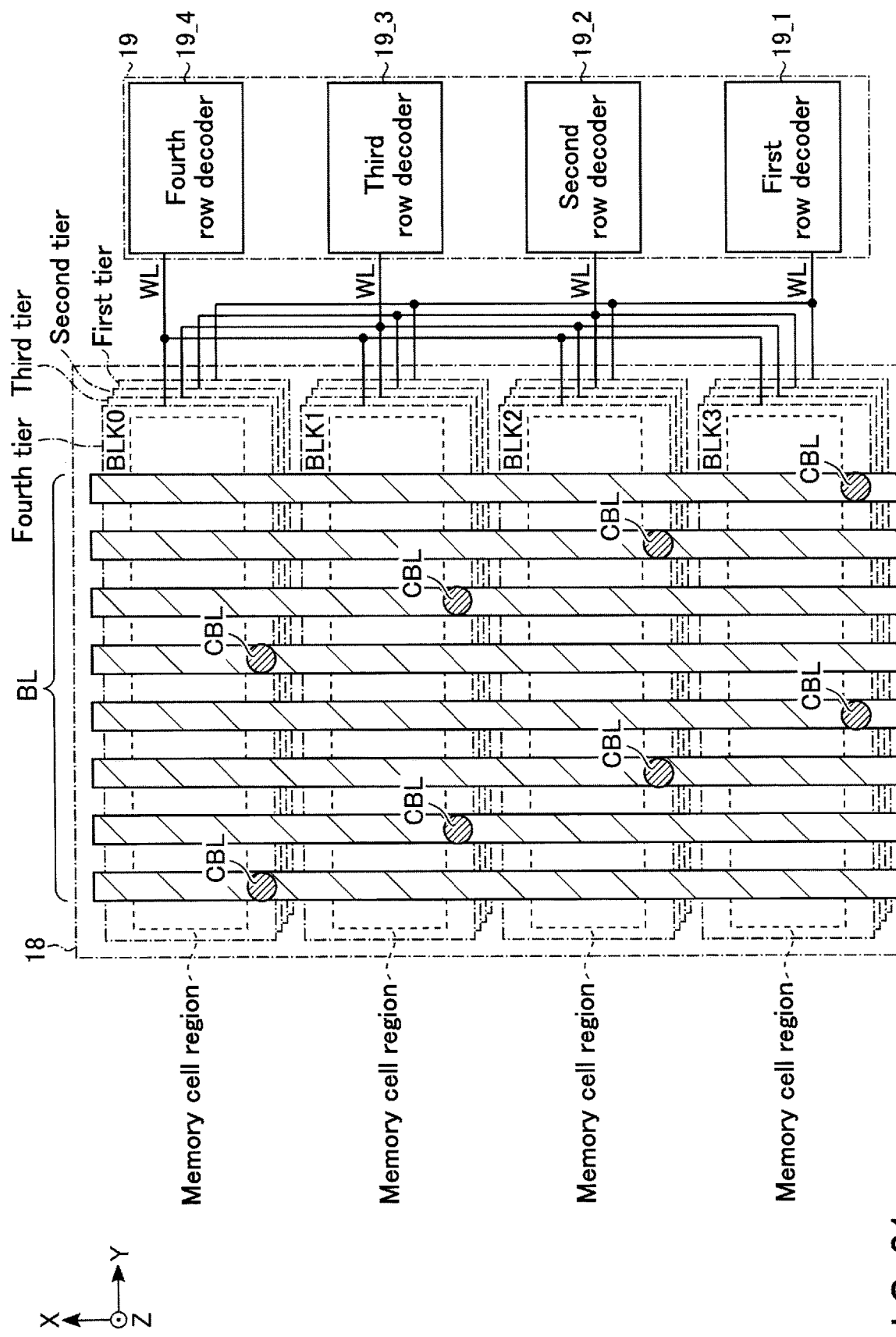
FIG. 21 is a diagram showing coupling between a memory cell array and row decoders included in the semiconductor memory device according to the third embodiment.

As shown in FIG. 21, the memory cell array 18 of each of the first to fourth tiers includes, for example, four blocks BLK (BLK0 to BLK3). In the third embodiment, the four blocks BLK share the bit lines BL. More specifically, for example, the bit line BL (4k) (k is an integer of 0 or more) is coupled to the block BLK0. Similarly, the bit line BL (4k+1) is coupled to the block BLK1, the bit line BL (4k+2) is coupled to the block BLK2, and the bit line BL (4k+3) is coupled to the block BLK3.

The row decoder 19 includes a first row decoder 19_1, a second row decoder 192, a third row decoder 193, and a fourth row decoder 19_4. The first row decoder 19_1 corresponds to the memory cell array 18 of the first tier. The second row decoder 19_2 corresponds to the memory cell array 18 of the second tier. The third row decoder 19_3 corresponds to the memory cell array 18 of the third tier. The fourth row decoder 19_4 corresponds to the memory cell array 18 of the fourth tier.

In each of the tiers, the word lines WL of the blocks BLK0 to BLK3 are coupled in common to the row decoder 19. More specifically, for example, the word lines WLa0 of the four blocks BLK0 to BLK3 of the first tier are coupled in common to the first row decoder 19_1. Similarly, the word lines WLb0 of the block BLK0 to BLK3 are coupled in common to the first row decoder 191. The same holds true for the other word lines WL. Like in the first tier, the word lines WL (WL_2) of the blocks BLK0 to BLK3 of the second tier are coupled in common to the second row decoder 192. The word lines WL (WL_3) of the blocks BLK0 to BLK3 of the third tier are coupled in common to the third row decoder 193. The word lines WL (WL_4) of the blocks BLK0 to BLK3 of the fourth tier are coupled in common to the fourth row decoder 19_4.

For example, in write or read operation, one tier can be selected by selecting one of the first to fourth row decoders 19_1 to 19_4. Furthermore, one of the blocks BLK0 to BLK3 can be selected by selecting a bit line BL.

3.2.2 Specific Example of Coupling Between Word Lines and Row Decoders

Figure 22:
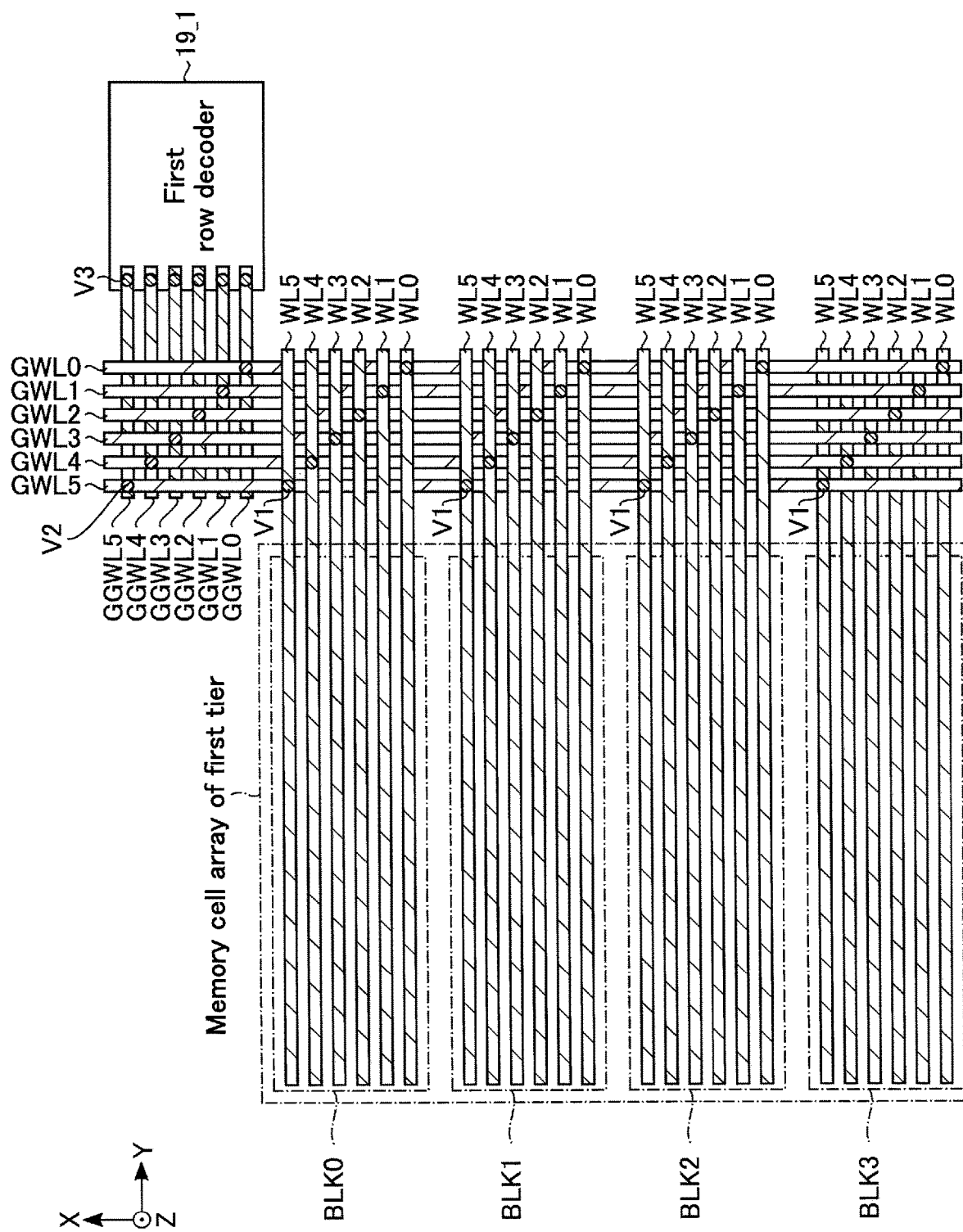
FIG. 22 is a diagram showing coupling between first-tier word lines and a first row decoder in the memory cell array included in the semiconductor memory device according to the third embodiment.
Figure 23:
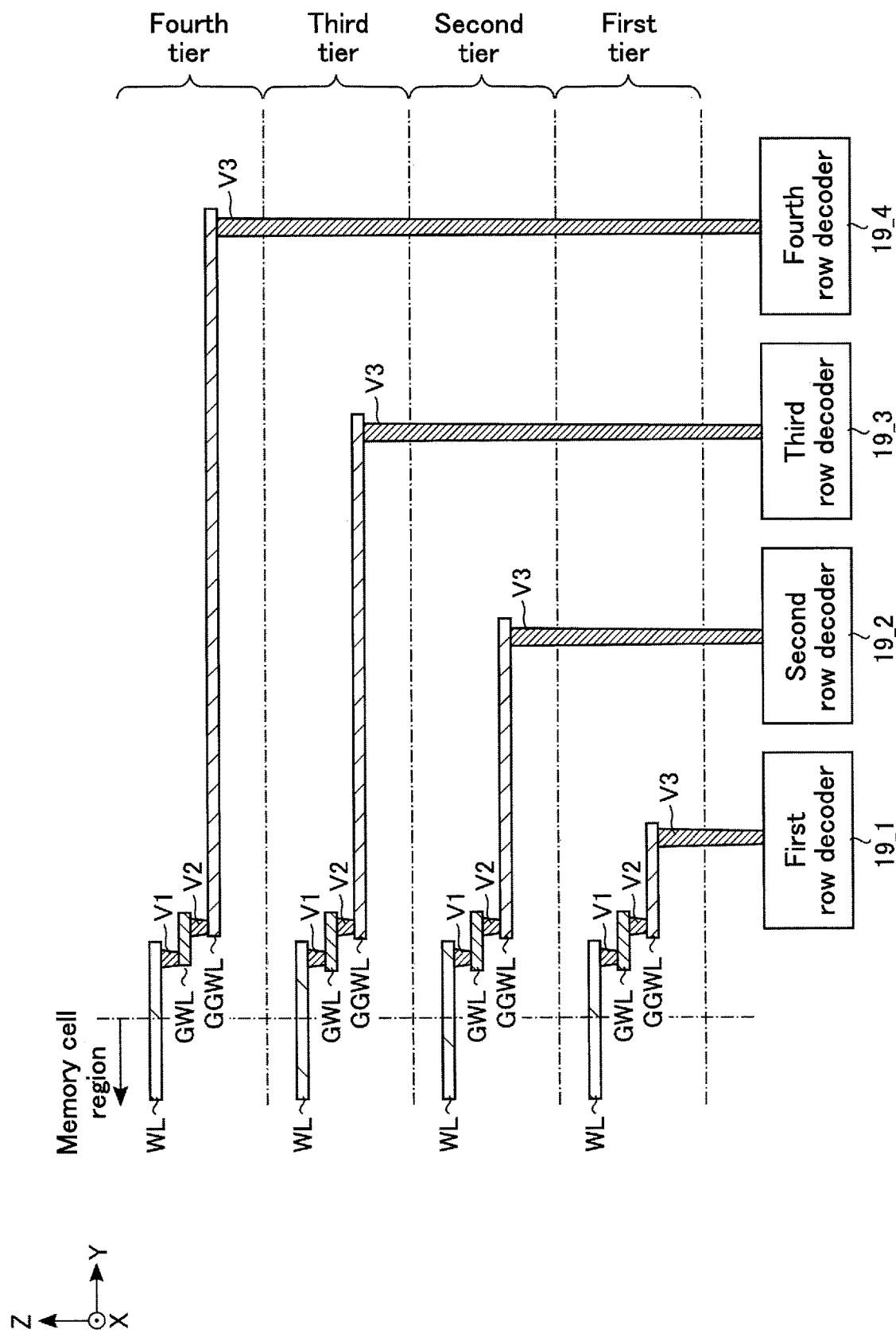
FIG. 23 is a sectional view showing coupling between word lines and row decoders in the semiconductor memory device according to the third embodiment.

A specific example of coupling between the word lines WL and the row decoder 19 will be described with reference to FIGS. 22 and 23. FIG. 22 is a plan view showing an example of coupling between the memory cell array 18 of the first tier and the first row decoder 19_1. FIG. 23 is a sectional view of coupling between the word lines WL in the first to fourth tiers and the row decoder 19. Note that the example of FIG. 22 shows coupling between the memory cell array 18 of the first tier and the first row decoder 19_1 and the same holds true for the second to fourth tiers.

As shown in FIG. 22, the word lines WL in each block BLK will be referred to as word lines WL0 to WL5. Interconnects GWL0 to GWL5 are provided below the word lines WL0 to WL5 to extend in the X direction. For example, the word line WL0 in each block BLK is coupled to the interconnect GWL0 via the contact plug V1. Similarly, the word lines WL1 to WL5 in each block BLK are coupled to the interconnects GWL1 to GWL5 via the contact plugs V1, respectively.

Interconnects GGWL0 to GGWL5 are provided below the interconnects GWL0 to GWL5 to extend in the Y direction. The interconnects GWL0 to GWL5 are coupled to the interconnects GGWL0 to GGWL5 via the contact plugs V2, respectively. The interconnects GGWL0 to GGWL5 are coupled to the first row decoder 19_1 via their respective contact plugs V3.

Next is a description of the sectional configuration of coupling between the word lines WL and the row decoder 19.

As shown in FIG. 23, the word lines WL of the first tier are coupled to the first row decoder 19_1 via the contact plug V1, interconnect GWL, contact plug V2, interconnect GGWL and contact plug V3. The same holds true for the second to fourth tiers. Therefore, the height of the contact plug V3 varies from tier to tier.

3.3. Advantages of Third Embodiment

The configuration according to the third embodiment can be applied to the first and second embodiments.

With the configuration according to the third embodiment, the word lines WL of the blocks BLK in which the bit lines BL are distributed, can be coupled in common to the row decoder 19 in each of the tiers. It is thus possible to suppress an increase in the area of the row decoder 19 in the configuration in which the memory cell arrays are stacked. The increase in chip area can be suppressed.

4. Modification, Etc

According to above embodiments, a semiconductor memory device includes: a first semiconductor layer (31) including first to third portions (HPR1 to HPR3) which are arranged along a first direction (X direction) and differ in position from one another in a second direction (Y direction) intersecting the first direction; a conductive layer (39) including a fourth portion (39a) extending in the second direction and a fifth portion (39b) coupled to the fourth portion and extending in the first direction; a first insulating layer (38) between the fourth portion and the first semiconductor layer and between the fifth portion and the first semiconductor layer; a first contact plug (CSGD) extending in a third direction (Z direction) intersecting the first direction and the second direction and coupled to the fourth portion; a second contact plug (CBL) extending in the third direction and coupled to the first semiconductor layer in a region (SGD region) where the first insulating layer is formed; a first interconnect (WLP) extending in the third direction; and a first memory cell (MC) apart from the fifth portion in the first direction and storing information between the semiconductor layer and the first interconnect.

The foregoing embodiments make it possible to provide a semiconductor memory device capable of suppressing an increase in chip area. Note that the embodiments are not limited to the above descriptions but various modifications can be made.

The term "couple" in the above-described embodiments includes indirect coupling via a transistor, a resistor or the like.

In the above embodiments, the same distance includes an error due to manufacturing variations or the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first semiconductor layer including first to third portions which are arranged along a first direction and differ in position from one another in a second direction intersecting the first direction;
a conductive layer including a fourth portion extending in the second direction and a fifth portion coupled to the fourth portion and extending in the first direction;
a first insulating layer between the fourth portion and the first semiconductor layer and between the fifth portion and the first semiconductor layer;
a first contact plug extending in a third direction intersecting the first direction and the second direction, and coupled to the fourth portion;
a second contact plug extending in the third direction and coupled to the first semiconductor layer in a region where the first insulating layer is formed;
a first interconnect extending in the third direction; and
a first memory cell apart from the fifth portion in the first direction and storing information between the semiconductor layer and the first interconnect.

2. The device according to claim 1, wherein the first insulating layer is provided between the fifth portion and the first portion, between the fifth portion and the second portion, between the fifth portion and the third portion, and between the third portion and the fourth portion.

3. The device according to claim 1, wherein the first semiconductor layer further includes:
a sixth portion which is in contact with the first portion and coupled to the second contact plug; and
a seventh portion coupled to the sixth portion symmetrically with regard to the first portion.

4. The device according to claim 3, wherein the first portion and the seventh portion differ in position in the second direction.

5. The device according to claim 1, wherein the first memory cell includes:
a second insulating layer between the first interconnect and the first semiconductor layer;
a charge storage layer between the first interconnect and the second insulating layer; and
a third insulating layer between the first interconnect and the charge storage layer.

6. The device according to claim 1, further comprising:
a second semiconductor layer including an eighth portion and a ninth portion which are adjacent to the first semiconductor layer in the second direction, arranged along the first direction, and differ in position from each other in the second direction;
a fourth insulating layer; and
a second memory cell apart from the first memory cell in the second direction and storing information between the second semiconductor layer and the first interconnect,
wherein the conductive layer further includes a tenth portion separated from the fifth portion in the second direction and extending in the first direction; and the fourth insulating layer is provided between the second semiconductor layer and the tenth portion and between the second semiconductor layer and the fourth portion.

7. The device according to claim 6, wherein a distance between the second portion and the eighth portion in the second direction is equal to a distance between the third portion and the ninth portion.

8. A semiconductor memory device comprising:
first and second semiconductor layers arranged adjacent to each other in a first direction and extending in a second direction intersecting the first direction;
a conductive layer including a first portion extending in the first direction, a second portion extending in the second direction, and a third portion separated from the second portion in the first direction and extending in the second direction;
a first insulating layer between the first portion and the first semiconductor layer and between the second portion and the first semiconductor layer;
a second insulating layer between the first portion and the second semiconductor layer and between the third portion and the second semiconductor layer;
a first contact plug extending in a third direction intersecting the first direction and the second direction, and coupled to the first portion;
a third insulating layer between the first portion and the first contact plug;
fourth and fifth insulating layers extending in the third direction and penetrating the first portion;
a second contact plug extending in the third direction and coupled to the first semiconductor layer in a region where the first insulating layer is formed;
a third contact plug extending in the third direction and coupled to the second semiconductor layer in a region where the second insulating layer is formed;
a first interconnect between the first semiconductor layer and the second semiconductor layer in the first direction and extending in the third direction;
a first memory cell apart from the second portion in the second direction and storing information between the first semiconductor layer and the first interconnect; and
a second memory cell apart from the first memory cell in the first direction and storing information between the second semiconductor layer and the first interconnect,
wherein the first semiconductor layer and the fourth insulating layer are arranged along the second direction;
the second semiconductor layer and the fifth insulating layer are arranged along the second direction;
a distance between a side of the first portion toward the second direction and the fourth insulating layer is equal to a distance between the side and the fifth insulating layer; and
the side is partly curved.

9. The device according to claim 8, wherein the fourth insulating layer and the fifth insulating layer are arranged along the first direction.

10. The device according to claim 8, wherein at least one of the fourth insulating layer and the fifth insulating layer is in contact with the third insulating layer.

11. The device according to claim 8, wherein a distance between the third insulating layer and the fourth insulating layer is equal to a distance between the third insulating layer and the fifth insulating layer.

12. The device according to claim 8, wherein the first and second memory cells each include:
a sixth insulating layer between the first interconnect and the first semiconductor layer;
a charge storage layer between the first interconnect and the second insulating layer; and
a seventh insulating layer between the first interconnect and the charge storage layer.

13. The device according to claim 8, wherein the second contact plug is located in a position different from the third contact plug in the first and second directions.

14. A semiconductor memory device comprising:
a semiconductor substrate;
a first memory cell array including:
a first memory block including:
a plurality of first semiconductor layers stacked in a first direction perpendicular to the semiconductor substrate and extending in a second direction parallel to the semiconductor substrate;
a first interconnect adjacent to the first semiconductor layers in a third direction intersecting the first and second directions and extending in the first direction; and
a first word line coupled to the first interconnect and extending in the third direction, and
a second memory block including:
a plurality of second semiconductor layers stacked in the first direction and extending in the second direction;
a second interconnect adjacent to the second semiconductor layers in the third direction and extending in the first direction; and
a second word line coupled to the second interconnect and extending in the third direction, and
a second memory cell array including:
a third memory block including:
a plurality of third semiconductor layers on the first memory cell array, stacked in the first direction, and extending in the second direction;
a third interconnect adjacent to the third semiconductor layers in the third direction and extending in the first direction; and
a third word line coupled to the third interconnect and extending in the third direction, and
a fourth memory block including:
a plurality of fourth semiconductor layers stacked in the first direction and extending in the second direction;
a fourth interconnect adjacent to the fourth semiconductor layers in the third direction and extending in the first direction; and
a fourth word line coupled to the fourth interconnect and extending in the third direction;
a first contact plug coupled to the first semiconductor layers and the third semiconductor layers and extending in the third direction;
a second contact plug coupled to the second semiconductor layers and the fourth semiconductor layers and extending in the third direction;
a first row decoder coupled to the first and second word lines; and
a second row decoder coupled to the third and fourth word lines.

15. The device according to claim 14, wherein the first memory block includes a plurality of first memory cells storing information between the first semiconductor layers and the first interconnect.

16. The device according to claim 14, wherein the first memory block further includes:
- a plurality of conductive layers stacked in the first direction and each including a first portion extending in the third direction and a second portion coupled to the first portion and extending in the second direction;
- a plurality of insulating layers each provided between the first portion and one of the first semiconductor layers and between the second portion and one of the first semiconductor layers; and
- a first contact plug extending in the first direction and coupled to the first portion of the one of the conductive layers.

17. The device according to claim 15, wherein the first memory cells each include:
- a second insulating layer between the first interconnect and the first semiconductor layers;
- a charge storage layer provided the first interconnect and the second insulating layer; and
- a third insulating layer provided the first interconnect and the charge storage layer.

* * * * *